United States Patent
Liu et al.

(10) Patent No.: US 9,991,333 B1
(45) Date of Patent: Jun. 5, 2018

(54) METAL-INSULATOR-METAL (MIM) CAPACITOR STRUCTURE AND METHOD FOR FORMING THE SAME

(71) Applicant: Taiwan Semiconductor Manufacturing Co., Ltd., Hsinchu (TW)

(72) Inventors: Ming-Chyi Liu, Hsinchu (TW); Shih-Chang Liu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 15/428,678

(22) Filed: Feb. 9, 2017

(51) Int. Cl.
*H01L 27/108* (2006.01)
*H01L 29/94* (2006.01)
*H01L 49/02* (2006.01)

(52) U.S. Cl.
CPC .............. *H01L 28/92* (2013.01); *H01L 28/86* (2013.01); *H01L 28/87* (2013.01); *H01L 28/88* (2013.01); *H01L 28/90* (2013.01); *H01L 28/91* (2013.01)

(58) Field of Classification Search
CPC .......................................... H01L 28/86–28/92

USPC .................................................. 257/307, 308
See application file for complete search history.

(56) References Cited

U.S. PATENT DOCUMENTS

| | | | |
|---|---|---|---|
| 6,750,495 B1 * | 6/2004 | Alers ................ | H01L 27/10894 257/296 |
| 7,880,268 B2 * | 2/2011 | Cremer .................... | H01L 28/91 257/532 |
| 9,691,839 B2 * | 6/2017 | Lindert ................. | H01L 27/108 |
| 2012/0276721 A1 * | 11/2012 | Chung .............. | H01L 21/02164 438/483 |
| 2015/0118821 A1 * | 4/2015 | Millward ................ | H01L 28/40 438/386 |

* cited by examiner

*Primary Examiner* — David Vu
*Assistant Examiner* — Brandon Fox
(74) *Attorney, Agent, or Firm* — Birch, Stewart, Kolasch & Birch, LLP

(57) ABSTRACT

A metal-insulator-metal (MIM) capacitor structure and a method for forming the MIM capacitor are provided. The MIM capacitor structure includes a substrate. A MIM capacitor is formed on the substrate. The MIM capacitor includes a U-shaped electrode having a first portion. The MIM capacitor also includes an inverted U-shaped electrode. The first portion of the U-shaped electrode is clamped by the inverted U-shaped electrode. The MIM capacitor further includes an insulating film between the U-shaped electrode and the inverted U-shaped electrode.

20 Claims, 14 Drawing Sheets

METAL-INSULATOR-METAL (MIM) CAPACITOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

One type of capacitor is a metal-insulator-metal (MIM) capacitor, which is used in mixed signal devices and logic devices, such as embedded memories and radio frequency devices. Metal-insulator-metal capacitors are used to store a charge in a variety of semiconductor devices. Although existing processes for manufacturing metal-insulator-metal capacitors have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
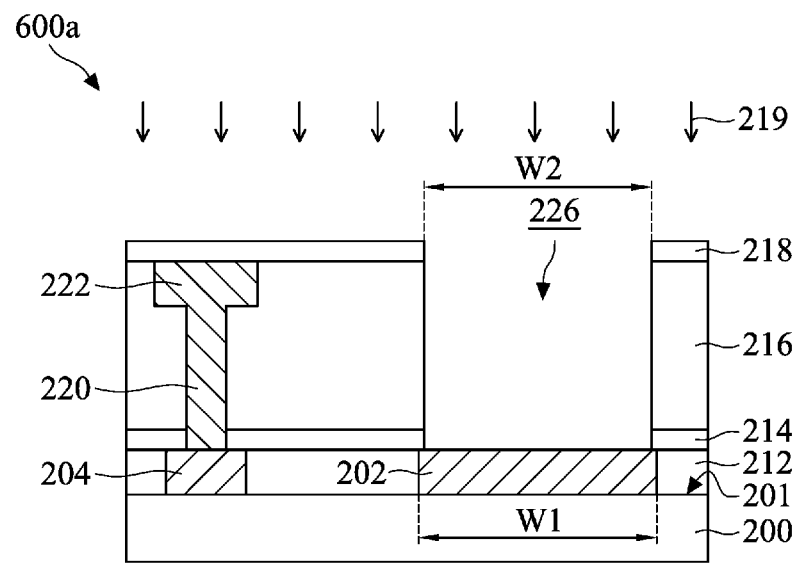
FIGS. 1A to 1J are cross-sectional representations of various stages of forming a metal-insulator-metal (MIM) capacitor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments a metal-insulator-metal (MIM) capacitor structure and a method for forming the MIM capacitor are provided. The MIM capacitor structure includes a MIM capacitor over a substrate. The MIM capacitor includes a bottom electrode, a top electrode and an insulating layer between the bottom electrode and the top electrode. The bottom electrode and the top electrode both have fin portions along a direction that is substantially perpendicular to a top surface of a substrate. Also, the top electrode filling spaces between the fin portions of the bottom electrode. The fin portions of the bottom electrode are self-aligned formed on a sidewall of the dielectric layer or a conductive pillar. Therefore, the MIM capacitor structure has high-density and small size.

FIGS. 1A to 1J are cross-sectional representations of various stages of forming a metal-insulator-metal (MIM) capacitor structure 600a including a metal-insulator-metal (MIM) capacitor 500a in accordance with some embodiments. As shown in FIG. 1A, a substrate 200 is received in accordance with some embodiments. The substrate 200 may be a semiconductor wafer such as a silicon wafer. Alternately or additionally, the substrate 200 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. In some embodiments, the substrate 200 includes an epitaxial layer. For example, the substrate 200 has an epitaxial layer overlying a bulk semiconductor.

Some device elements (not shown) are formed in the substrate 200. Device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 200 in a front-end-of-line (FEOL) process.

The substrate 200 may include various doped regions such as p-type wells or n-type wells). Doped regions may be doped with p-type dopants, such as boron or BF2, and/or n-type dopants, such as phosphorus (P) or arsenic (As). The doped regions may be formed directly on the substrate 200, in a P-well structure, in an N-well structure or in a dual-well structure.

The substrate 200 may further include isolation features (not shown), such as shallow trench isolation (STI) features or local oxidation of silicon (LOCOS) features. Isolation features may surround and isolate various device elements.

As shown in FIG. 1A, a first dielectric layer 212 (such as an inter-metal dielectric (IMD) layer) is formed over a top surface 201 of the substrate 200. Conductive features 202 and 204 are embedded in the first dielectric layer 212. The first dielectric layer 212, the conductive feature 202 and the conductive feature 204 are formed in a back-end-of-line (BEOL) process.

In some embodiments, the first dielectric layer 212 is made of silicon oxide. In some other embodiments, the first dielectric layer 212 is made of un-doped silicate glass (USG), fluorinated silicate glass (FSG), carbon-doped silicate glass, silicon nitride or silicon oxynitride.

In some embodiments, the first dielectric layer 212 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

In some embodiments, the conductive features 202 and 204 are made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive features 202 and 204 are formed by a plating method.

After the conductive features 202 and 204 are formed, a first etch stop layer 214 is formed over the first dielectric layer 212, as shown in FIG. 1A in accordance with some embodiments. The first etch stop layer 214 may be a single layer or multiple layers. The first etch stop layer 214 is made of silicon carbide (SiC), silicon nitride ($SixNy$), silicon carbonitride (SiCN), silicon oxycarbide (SiOC), silicon oxycarbon nitride (SiOCN), tetraethoxysilane (TEOS) or another applicable material. In some embodiments, the first etch stop layer 214 has a bi-layer structure which includes a TEOS layer formed on a SiC layer. A TEOS layer has better moisture prevention than a silicon carbide (SiC) layer. In addition, a SiC layer is used as a glue layer to improve adhesion between the underlying layer and the TEOS layer. In some embodiments, the first etch stop layer 214 is formed by performing a plasma enhanced chemical vapor deposition (CVD) process, a low pressure CVD process, an atomic layer deposition (ALD) process, or another applicable process.

After the first etch stop layer 214 is formed, a second dielectric layer 216 such as an inter-metal dielectric (IMD) layer) is formed over the first etch stop layer 214, as shown in FIG. 1A in accordance with some embodiments. The second dielectric layer 216 may be a single layer or multiple layers. In some embodiments, the second dielectric layer 216 is made of silicon oxide. In some other embodiments, the second dielectric layer 216 is made of un-doped silicate glass (USG), fluorinated silicate glass (FSG), carbon-doped silicate glass, silicon nitride or silicon oxynitride.

In some embodiments, the second dielectric layer 216 includes an extreme low-k (ELK) dielectric layer. ELK dielectric layer is made of ELK dielectric material which has a dielectric constant (k) less than about 2.5. ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials are made of a material including a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

After the second dielectric layer 216 is formed, a metal line 222 and a via 220 are formed over the substrate 200, as shown in FIG. 1A in accordance with some embodiments. The metal line 222 and the via 220 are electrically connected to the the conductive feature 204. In some embodiments, the metal line 222 and the via 220 are embedded in second dielectric layer 216. The metal line 222 and the via 220 may be made of a conductive material, such as copper (Cu), aluminum (Al), tungsten (W), or another applicable material. In some embodiments, the metal line 222 and the via 220 are copper or copper alloy. In some embodiments, the metal line 222 and the via 220 are formed by single and/or dual damascene processes. The metal line 222 may include multiple metal layers (namely M1, M2, M3 . . . , and Mtop) which are interconnected through the via 220. In some embodiments, another metal line and another via are formed over and electrically connected to the metal line 222 and the via 220.

After the metal line 222 and the via 220 are formed, a second etch stop layer 218 is formed over the second dielectric layer 216, as shown in FIG. 1A in accordance with some embodiments. The second etch stop layer 218 may be a single layer or multiple layers. The second etch stop layer 218 is made of silicon carbide (SiC), silicon nitride ($SixNy$), silicon carbonitride (SiCN), silicon oxycarbide (SiOC), silicon oxycarbon nitride (SiOCN), tetraethoxysilane (TEOS) or another applicable material. In some embodiments, the second etch stop layer 218 has a bi-layer structure which includes a TEOS layer formed on a SiC layer. A TEOS layer has better moisture prevention than a silicon carbide (SiC) layer. In addition, a SiC layer is used as a glue layer to improve adhesion between the underlying layer and the TEOS layer. In some embodiments, the second etch stop layer 218 is formed by performing a plasma enhanced chemical vapor deposition (CVD) process, a low pressure CVD process, an atomic layer deposition (ALD) process, or another applicable process.

After the second etch stop layer 218 is formed, a patterning process 219 is performed to form a hole 226 in the second etch stop layer 218 and the second dielectric layer 216, as shown in FIG. 1A in accordance with some embodiments. In some embodiments, the position of the hole 226 provides a position of a MIM capacitor formed in the following processes. In some embodiments, the position of the hole 226 is directly above the conductive feature 202.

In some embodiments, the formation of the hole 226 includes performing a photolithography process and an following etching process. In some embodiments, the etching process is a dry etching process. In some embodiments, etching gases used in the etching process include fluorine-containing (F-containing) gases. During the etching process, portions of the second etch stop layer 218 and the second dielectric layer 216 are etched through an opening of an etching mask (not shown) formed by the photolithography process, and the etching process stops when the conductive feature 202 is exposed.

In some embodiments, a width W1 of the conductive feature 202 is greater than a width W2 of the hole 226, as shown in FIG. 1A in accordance with some embodiments. In some embodiments, the width W1 of the conductive feature 202 is less than or equal to the width W2 of the hole 226.

Figure 1B:
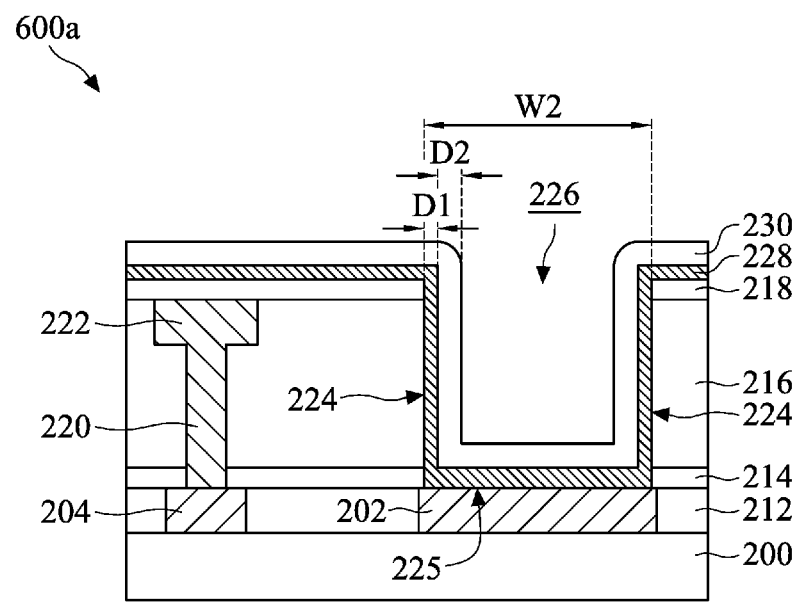

After the hole 226 is formed, a first conductive layer 228 is formed over the second etch stop layer 218, the second dielectric layer 216 and conductive feature 202, as shown in FIG. 1B in accordance with some embodiments. The first conductive layer 228 is formed lining the hole 226. That is, the first conductive layer 228 is conformally formed over a sidewall 224 and a bottom 225 of the hole 226.

In some embodiments, the first conductive layer 228 is made of metals. In some embodiments, the first conductive layer 228 is made of aluminum, copper, tungsten, titanium, tantalum, titanium nitride, tantalum nitride, or another applicable material. In some embodiments, the first conductive layer 228 is made of poly-silicon.

In some embodiments, the first conductive layer 228 is formed by performing a CVD process, a physical vapor deposition (PVD) process, an atomic layer deposition (ALD) process, or another applicable process.

In some embodiments, a thickness (or a width) D1 of the first conductive layer 228 is less than the width W2 of the hole 226. In some embodiments, the thickness D1 of the first conductive layer 228 is in a range from about 50 Å to about 10000 Å.

After the first conductive layer 228 is formed, a first insulating layer 230 is formed over the second etch stop layer 218, the second dielectric layer 216 and the conductive feature 202, as shown in FIG. 1B in accordance with some embodiments. The first insulating layer 230 is conformally formed on the first conductive layer 228. That is, the first insulating layer 230 is formed on the first conductive layer 228 over the sidewall 224 and the bottom 225 of the hole 226.

In some embodiments, the first insulating layer 230 includes one or more layers of insulating material such as oxide based materials including $SiO_2$, SiON and SiOCN.

In some embodiments, the first insulating layer 230 is formed by performing a plasma enhanced chemical vapor deposition (CVD) process, a low pressure CVD process, an atomic layer deposition (ALD) process, or another applicable process.

In some embodiments, a thickness (or a width) D2 of the first insulating layer 230 is less than the width W2 of the hole 226. In some embodiments, the thickness (or a width) D2 of the first insulating layer 230 is less than, equal to or greater than the thickness D1 of the first conductive layer 228. In some embodiments, the thickness D2 of the first insulating layer 230 is in a range from about 50 Å to about 10000 Å.

Figure 1C:
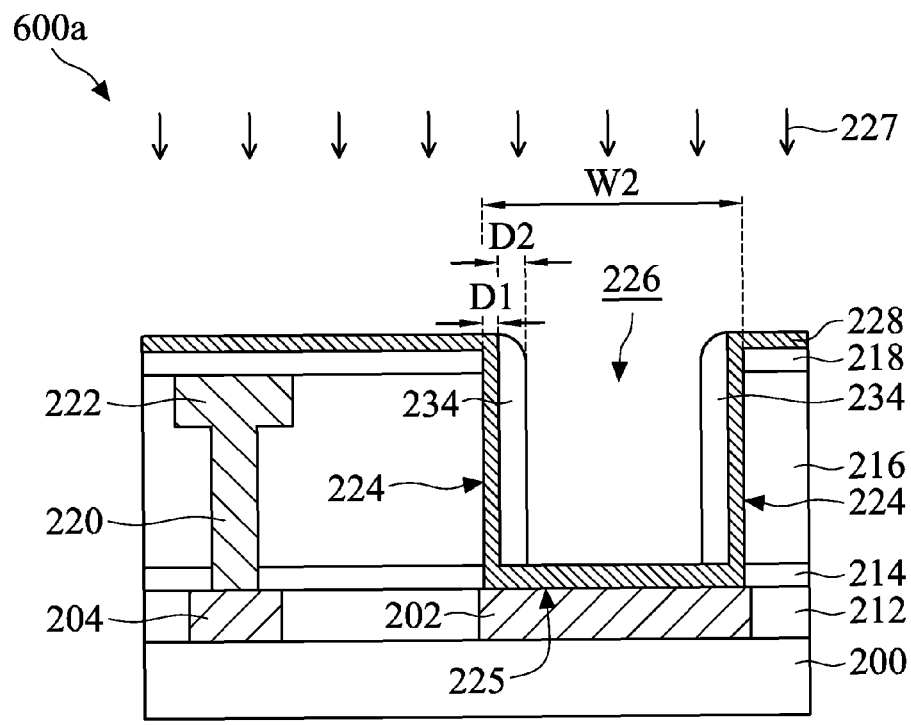

After the first insulating layer 230 is formed, an etching process 227 is performed on the first insulating layer 230, as shown in FIG. 1C in accordance with some embodiments. The etching process 227 is performed to remove the first insulating layer 230 above the first conductive layer 228 and to stop on the first conductive layer 228. In some embodiments, the etching process 227 includes a dry etching process, a wet etching process, or another applicable process. In some embodiments, etching gases used in the etching process include fluorine-containing (F-containing) gases.

After performing the etching process 227, first insulating spacers 234 are formed on the first conductive layer 228 on the sidewall 224 of the hole 226. As shown in FIG. 1C, the first insulating spacers 234 is self-aligned to the sidewall 224 of the hole 226, and therefore, complicated aligning processes are not required. Therefore, a portion of the first conductive layer 228, which is close to the bottom 225 of the hole 226 is exposed to the first insulating spacers 234. In addition, the first insulating spacers 234 are in contact with the first conductive layer 228 and separated from the second dielectric layer 216 through the first conductive layer 228.

Figure 1D:
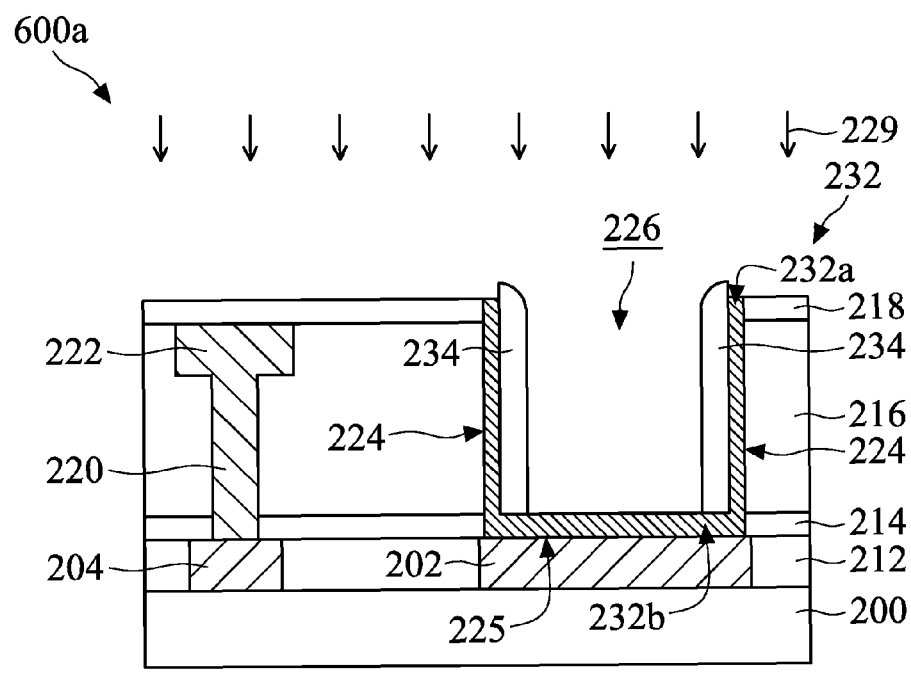

After the first insulating spacers 234 are formed, a removal process 229 is performed on the first conductive layer 228 above the second etch stop layer 218, as shown in FIG. 1D in accordance with some embodiments. In some embodiments, the removal process 229 includes a coating process, an etching-back process and a cleaning process performing in sequence.

The coating process is performed to form an anti-reflective coating (BARC) layer (not shown) covering the first insulating spacers 234 and the first conductive layer 228 and filling the hole 226. The BARC layer is used to protect the first insulating spacers 234 and the first conductive layer 228 in the hole 226 without being removed during the following etching-back process. The etching-back process is then performed to remove the BARC layer and the first conductive layer 228 above the second etch stop layer 218 and to stop on the second etch stop layer 218. After performing the etching-back process, the cleaning process is performed to remove the remaining BARC layer.

In some embodiments, the coating process includes a spin-on coating process or another applicable process. In some embodiments, the etching-back process includes a dry etching process, a wet etching process, a chemical mechanical polishing (CMP) process, or another applicable process. In some embodiments, etching gases used in the dry etching process include fluorine/chlorine-containing (F/Cl-containing) gases. In some embodiments, the cleaning process includes an ashing process and a solvent cleaning process.

In some embodiments, the removal process 229 includes a chemical mechanical polishing (CMP) process. The CMP process is performed to remove the first conductive layer 228 and the first insulating layer 230 above the second etch stop layer 218 and to stop on the second etch stop layer 218.

After performing the removal process 229, a first conductive layer 232 is formed, as shown in FIG. 1D in accordance with some embodiments. As described previously, the first conductive layer 228 is conformally formed over the sidewalls 224 and the bottom 225 of the hole 226 and over the top surface of the second etch stop layer 218 and the portion over the second etch stop layer 218 afterward. Therefore, the resulting first conductive layer 232 is self-aligned to the hole 226 without using complicated aligning processes. The first conductive layer 232 is conformally formed over the sidewalls 224 and the bottom 225 of the hole 226. The first conductive layer 232 includes a bottom portion 232b and fin portions 232a connected to the bottom portion 232b. Bottom portion 232b is positioned on the bottom 225 of the hole 226, and the fin portions 232a are in contact with the sidewall 224 of the hole 226. The bottom portion 232b is in contact with the conductive feature 202, and the fin portions 232a are in contact with the second dielectric layer 216.

The first insulating spacers 234 are formed on the first conductive layer 232 on the sidewall 224 of the hole 226. Therefore, a portion of the bottom portion 232b of the first conductive layer 232 is exposed by the first insulating spacers 234. In addition, the first insulating spacers 234 are in contact with the first conductive layer 232 and separated from the second dielectric layer 216 through the first conductive layer 232.

Figure 1E:
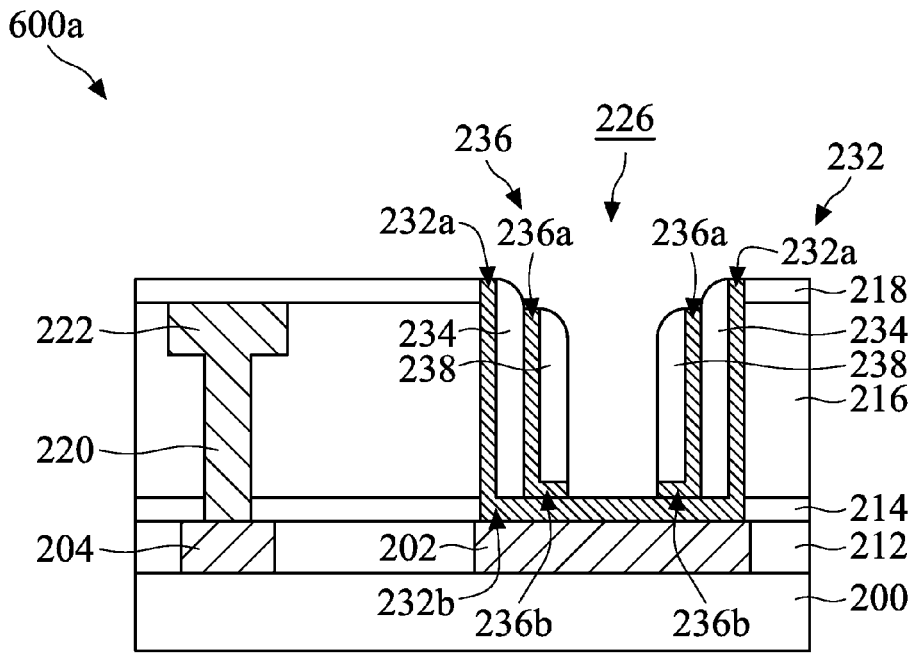

After the first insulating spacers 234 and the first conductive layer 232 are formed, processes similar to FIG. 1B to FIG. 1D are repeated to form a second conductive layer 236 and second insulating spacers 238 on the second conductive layer 236, as shown in FIG. 1E in accordance with some embodiments. Some materials and processes used to form the second conductive layer 236 may be similar to, or the same as, those used to form the first conductive layer 232. Some materials and processes used to form the second insulating spacers 238 may be similar to, or the same as, those used to form the first insulating spacers 234 and are not repeated herein.

The second conductive layer 236 is conformally formed over the sidewall 224 and the bottom 225 of the hole 226. The second conductive layer 236 includes a bottom portion 236b and fin portions 236a connected to the bottom portion 236b. Bottom portion 236b is positioned on the bottom 225 of the hole 226 and is in contact with the bottom portion 232b. The fin portions 236a are in contact with sidewalls of the first insulating spacers 234. In some embodiments, a removal process performed on the second conductive layer 236 can be controlled to remove a portion of the bottom portion 236b between the second insulating spacers 238, so that a portion of the bottom portion 232b is exposed by the hole 226.

The second insulating spacers 238 are formed on the second conductive layer 236 on the sidewall 224 of the hole 226. As shown in FIG. 1E, the second insulating spacers 238 is self-aligned to sidewalls of the second conductive layer 236, and therefore, complicated aligning processes are not required. In addition, the second insulating spacers 238 are in contact with the second conductive layer 236 and separated from the first insulating spacers 234 through the second conductive layer 236.

In some embodiments, the second conductive layer 236 and the second insulating spacers 238 are simultaneously formed by a single removal process after performing the deposition processes of a second conductive layer and a second insulating layer (not shown). That is, the second conductive layer 236 and the second insulating spacers 238 are self-aligned to the sidewalls of the first insulating spacers 234 without using complicated aligning processes. In some embodiments, the single removal process includes an etching-back process or a chemical mechanical polishing (CMP) process.

In some embodiments, a top of the second conductive layer 236 is lower than a top of the first conductive layer 232. Tops of the second insulating spacers 238 are lower than tops of the first insulating spacers 234.

Figure 1F:
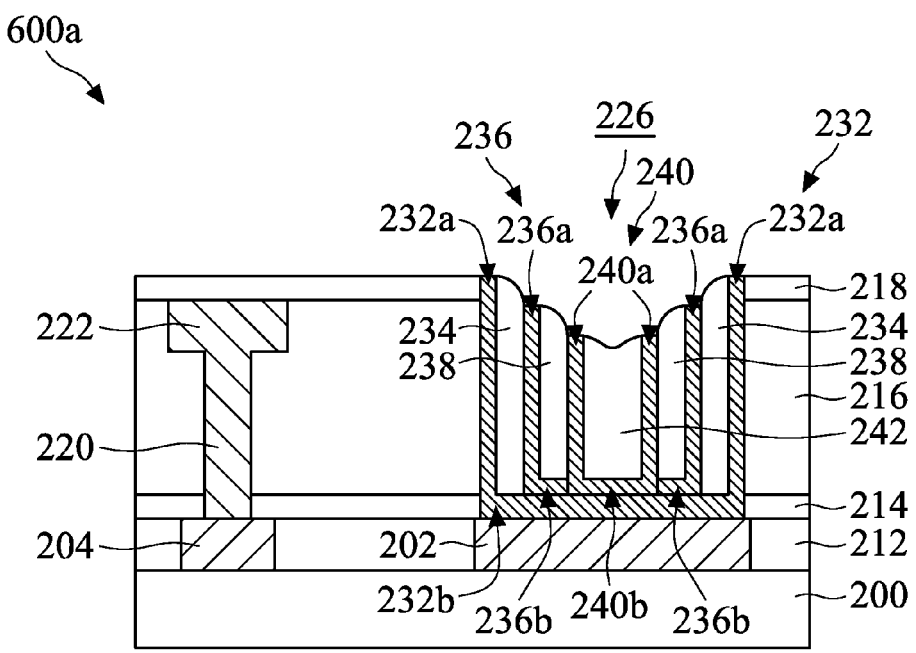

After the second insulating spacers 238 and the second conductive layer 236 are formed, processes similar to FIG. 1B to FIG. 1D are repeated to form a third conductive layer 240 and third insulating spacers 242 on the second conductive layer 236, as shown in FIG. 1F in accordance with some embodiments. Some materials and processes used to form the third conductive layer 240 may be similar to, or the same as, those used to form the first conductive layer 232 and the second conductive layer 236. Some materials and processes used to form the third insulating spacers 242 may be similar to, or the same as, those used to form the first insulating spacers 234 and the second insulating spacers 238 and are not repeated herein.

The third conductive layer 240 is conformally formed over the sidewall 224 and the bottom 225 of the hole 226. The third conductive layer 240 includes a bottom portion 240b and fin portions 240a connected to the bottom portion 240b. The bottom portion 240b is positioned on the bottom 225 of the hole 226 and is in contact with the bottom portion 232b and/or the bottom portion 236b. The fin portions 240a are in contact with sidewalls of the second insulating spacers 238.

The third insulating spacers 242 are formed over the third conductive layer 240 on the sidewall 224 of the hole 226 (i.e. the fin portions 240a). As shown in FIG. 1F, the third insulating spacers 242 are self-aligned to the third conductive layer 240, and therefore, complicated aligning processes are not required. In addition, the third insulating spacers 242 are in contact with the third conductive layer 240 and separated from the second insulating spacer 238 through the third conductive layer 240.

In some embodiments, the third insulating spacers 242 are merged to fill a space between the fin portions 240a, as shown in FIG. 1F.

In some embodiments, a top of the third conductive layer 240 is lower than the top of the second conductive layer 236. Tops of the third insulating spacers 242 are lower than tops of the second insulating spacers 238.

In some embodiments, processes similar to FIG. 1B to FIG. 1D are repeated one or more times until the hole 226 is filled with conductive layers and insulating spacers without any void therein. In some embodiments, the number of times processes similar to FIG. 1B to FIG. 1D are repeated depends on the width W2 of the hole 226 and the thicknesses of conductive layers and insulating spacers in the hole 226. The embodiments as shown in FIG. 1F merely examples and are not intended to be limiting the disclosure.

Figure 1G:
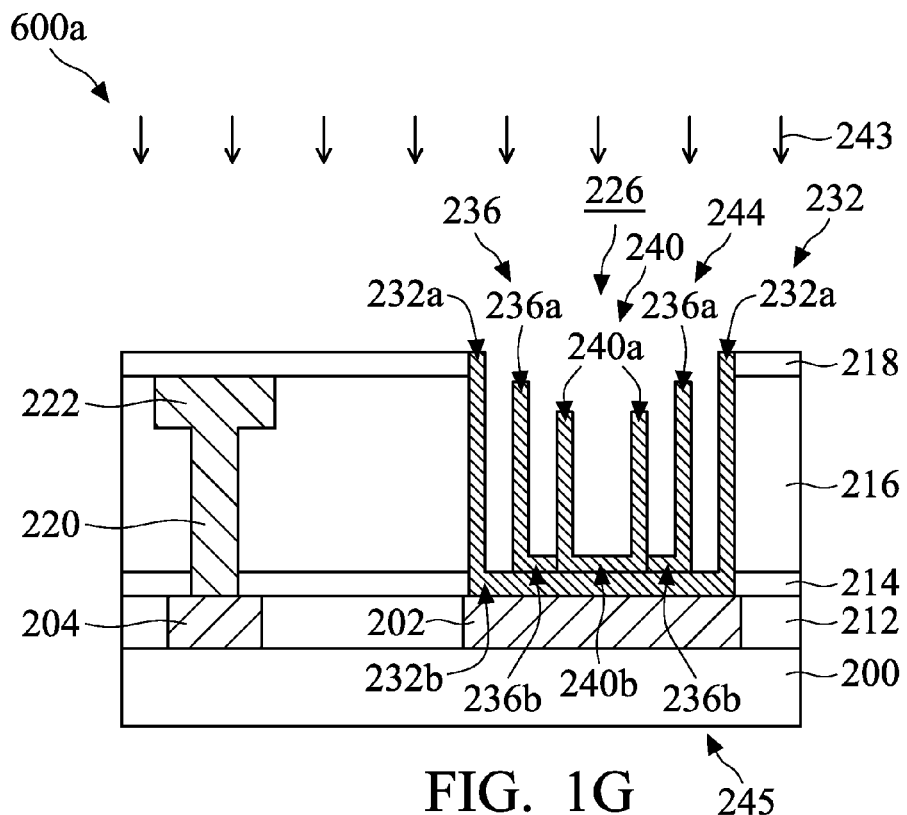

A selective etching process 243 is performed to remove the first insulating spacers 234, the second insulating spacers 238 and the third insulating spacers 242, as shown in FIG. 1G in accordance with some embodiments. In some embodiments, the conductive material for the fin portions 232a, the fin portions 236a and the fin portions 240a has a higher etching selectivity against the insulating material of the first insulating spacers 234, the second insulating spacers 238 and the third insulating spacers 242 during selective etching process 243. In addition, the insulating material for the second etch stop layer 218 has a higher etching selectivity against the insulating material of the first insulating spacers 234, the second insulating spacers 238 and the third insulating spacers 242 during the selective etching process 243.

In some embodiments, the selective etching process 243 includes a dry etching process, a wet etching process, or another applicable process. In some embodiments, the dry etching process includes a vapor phase hydrofluoric acid (VHF) dipping process.

After performing the selective etching process 243, the first conductive layer 232, the second conductive layer 236, the third conductive layer 240 are exposed by the hole 226 (e.g. without being covered by any insulating spacers). A first (bottom) electrode 244 of the MIM capacitor is formed.

In some embodiments, the first electrode 244 includes the fin portions 232a, the fin portions 236a, the fin portions 240a and a connection portion 245. In some embodiments, the connection portion 245 includes the bottom portion 232b, the bottom portion 236b and the bottom portion 240b, which are connected to each other.

Figure 1H:
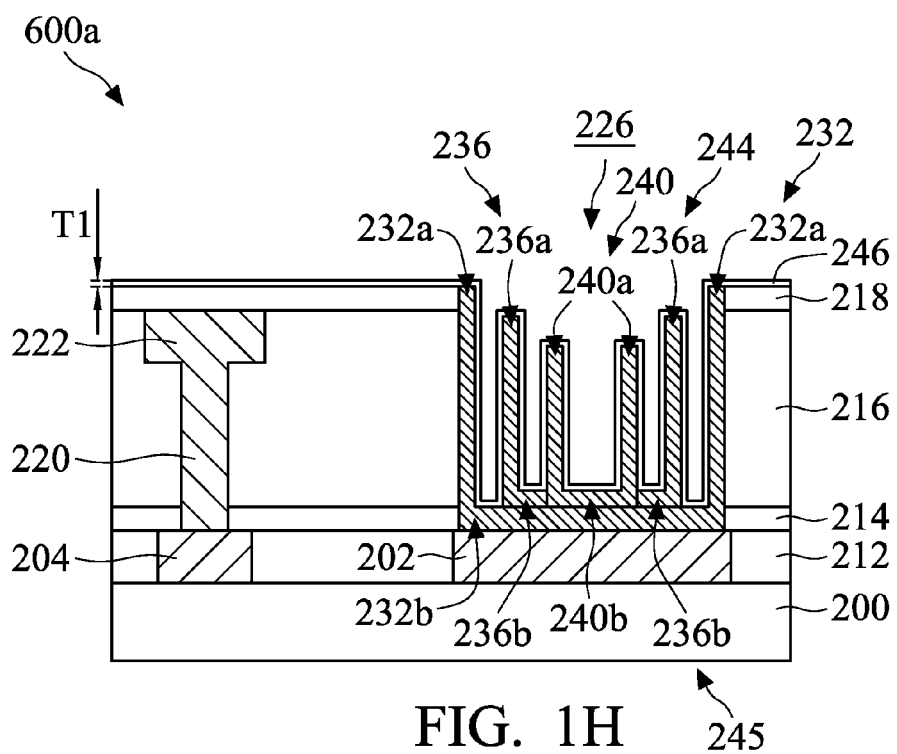

After the first electrode 244 is formed, an insulating film 246 is formed over the first electrode 244, as shown in FIG. 1H in accordance with some embodiments. The insulating film 246 is conformally formed on the first electrode 244. That is, the insulating film 246 is formed lining the tops of the fin portions 232a, the fin portions 236a and the fin portions 240a, the sidewalls of the fin portions 232a, the fin portions 236a and the fin portions 240a, and the connection portion 245 between the fin portions 232a, the fin portions 236a and the fin portions 240a. In some embodiments, the insulating film 246 is entirely formed on a top surface of the second etch stop layer 218.

In some embodiments, the insulating film 246 is made of a dielectric material including silicon oxide, SiOC, SiOCN, SiCN, or another applicable material. In some embodiments, insulating film 246 is made of a high-k dielectric material including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or another applicable material.

In some embodiments, the insulating film 246 is formed by performing a plasma enhanced chemical vapor deposition (CVD) process, a low pressure CVD process, an atomic layer deposition (ALD) process, or another applicable process.

In some embodiments, a thickness (or a width) T1 of the insulating film 246 is less than, equal to or greater than the thicknesses of the fin portions 232a, the fin portions 236a and the fin portions 240a. In some embodiments, the thickness T1 of insulating film 246 is in a range from about 50 Å to about 10000 Å.

Figure 1I:
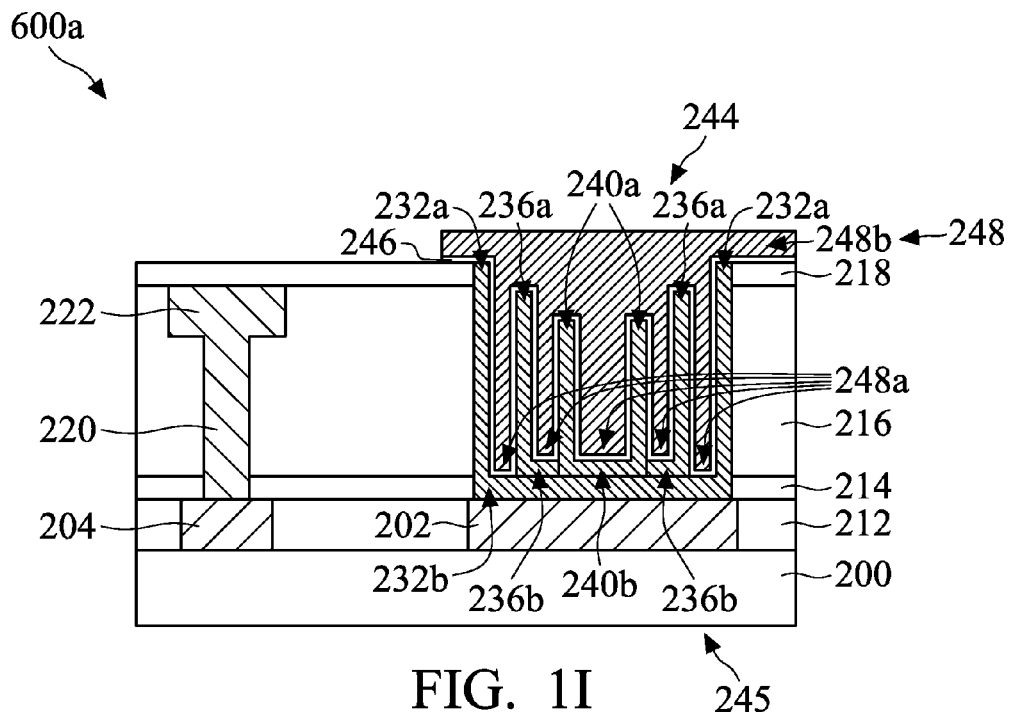

After the insulating film 246 is formed, a second (top) electrode 248 of the MIM capacitor is formed over the insulating film 246, as shown in FIG. 1I in accordance with some embodiments. The second electrode 248 is formed covering the insulating film 246 within the hole 226 and filling spaces between fin portions 232a, the fin portions 236a and the fin portions 240a of the first electrode 244. In some embodiments, the second electrode 248 is formed extending over a portion of the second etch stop layer 218 outside the first electrode 244.

Similar to the first electrode 244, the second electrode 248 includes fin portions 248a and a connection portion 248b. Tops and sidewalls of each of the fin portions 248a are in contact with the insulating film 246.

In some embodiments, a cross-sectional profile of the second electrode 248 is similar to an inverted cross-sectional profile of the first electrode 244. The fin portions 248a respectively in the spaces between the fin portions 232a, the fin portions 236a and the fin portions 240a of the first electrode 244. In addition, the fin portions 248a of the second electrode 248 are alternately arranged with the fin portions 236a and the fin portions 240a of the first electrode 244. The connection portion 248b of the second electrode 248 covers the first electrode 244.

In some embodiments, the second electrode 248 is made of metals. In some embodiments, the second electrode 248 is aluminum, copper, tungsten, titanium, tantalum, titanium nitride, tantalum nitride, or another applicable metal. In some embodiments, the second electrode 248 is made of poly-silicon.

In some embodiments, the second electrode 248 is formed by a deposition process and a subsequent patterning process. In some embodiments, the deposition process includes a CVD process, a PVD process, an atomic layer deposition (ALD) process, or another applicable process. In some embodiments, the patterning process includes a photolithography process and a subsequent etching process. In some embodiments, the etching process is a dry etching process. In some embodiments, etching gases used in the etching process include fluorine/chlorine/boron trichloride-containing (F/Cl/BCl$_3$-containing) gases. In some embodiments, the etching process also removes the insulating film 246 without covered by the second electrode 248, shown in FIG. 1I.

Figure 1J:
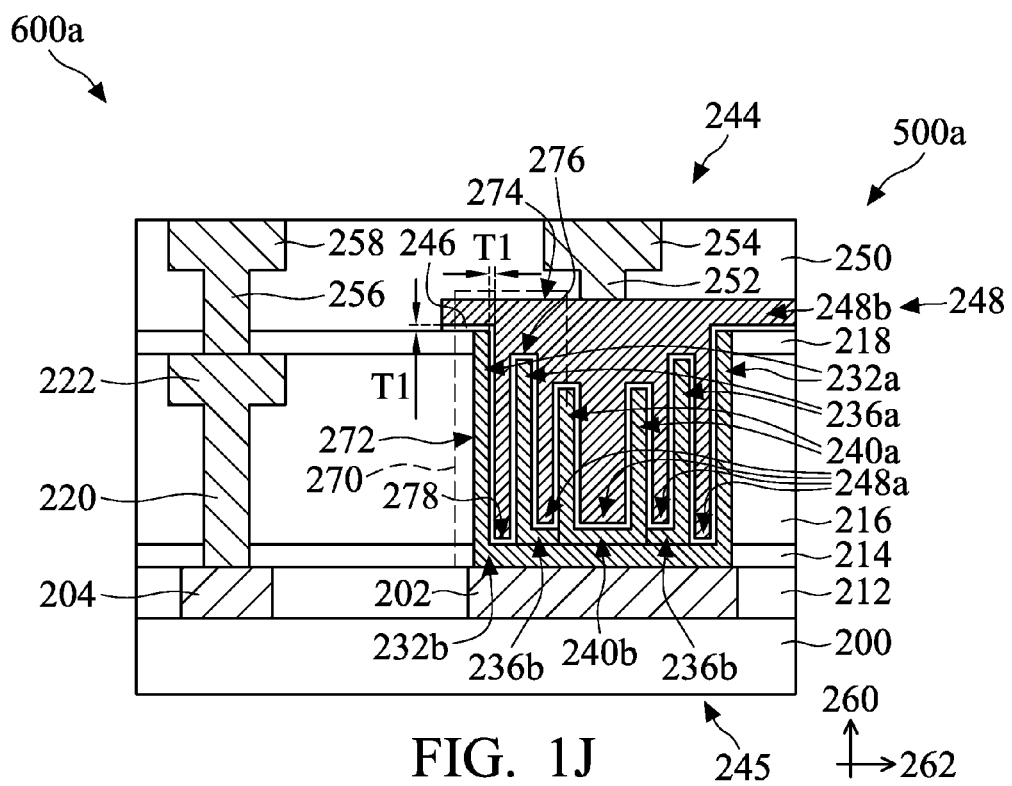

After the second electrode 248 is formed, a third dielectric layer 250 is formed over the second etch stop layer 218, as shown in FIG. 1J in accordance with some embodiments. The third dielectric layer 250 is formed covering the second electrode 248. Some materials and processes used to form the third dielectric layer 250 may be similar to, or the same as, those used to form the second dielectric layer 216.

After the third dielectric layer 250 is formed, a via 252, a metal line 254, a via 256 and a metal line 258 are formed over the second dielectric layer 216, as shown in FIG. 1J in accordance with some embodiments. The metal line 258 and the via 256 are electrically connected to the metal line 222 and the via 220. The metal line 258 and the via 256 are electrically connected to the second electrode 248. Some materials and processes used to form the via 252, the via 256, the metal line 254 and the metal line 258 may be similar to, or the same as, those used to form the via 220 and the metal line 222.

After performing the aforementioned processes, a metal-insulator-metal (MIM) capacitor 500a is formed over the substrate 200, as shown in FIG. 1J in accordance with some embodiments.

In some embodiments, the MIM capacitor 500a is formed through the second dielectric layer 216. The MIM capacitor 500a is surrounded by the second dielectric layer 216 and includes the first electrode 244, the second electrode 248 and the insulating film 246 sandwiched between the first electrode 244 and the second electrode 248.

In some embodiments, the first electrode 244 includes the fin portions 232a, the fin portions 236a, the fin portions 240a and the first connection portion 245. The fin portions 232a, the fin portions 236a and the fin portions 240a are formed protruding from the first connection portion 245 along a first direction 260 substantially perpendicular to the top surface 201 of the substrate 200. The connection portion 245 is formed extending along a second direction 262 substantially parallel to the top surface 201 of the substrate 200. In some embodiments, the first electrode 244 is comb-shaped in the cross-sectional representation shown in FIG. 1J.

In some embodiments, heights of the first conductive layer 232, the second conductive layer 236 and the third conductive layer 240 of the first electrode 244 are decreased linearly from the first conductive layer 232 to the third conductive layer 240.

In some embodiments, the second electrode 248 includes the fin portions 248a and the second connection portion 248b. The fin portions 248a are formed protruding from the first connection portion 245 along the first direction 260. The connection portion 248b is formed covering the spaces between the fin portions 232a, the fin portions 236a and the fin portions 240a. In addition, the connection portion 248b is formed extending substantially along the second direction 262. In some embodiments, the second electrode 248 is comb-shaped in the cross-sectional representation shown in FIG. 1J.

In some embodiments, the fin portions 232a, the fin portions 236a, the fin portions 240a of the first electrode 244 and the fin portions 248a of the second electrode 248 are alternately arranged substantially along the second direction 262. In some embodiments, the fin portions 232a, the fin portions 236a and the fin portions 240a of the first electrode 244 respectively have ends away from the first connection portion 245 and close to the second connection portion 248b of the second electrode 248.

In the MIM capacitor 500a, any two fin portions close to each other and the first connection portion 245 connected to the two fin portions form a U-shaped electrode in the cross-sectional representation shown in FIG. 1J. For example, the fin portion 232a, the fin portion 236a close to the fin portion 232a and the first connection portion 245 between the fin portion 232a and the fin portion 236a collectively form a U-shaped electrode 272 in a region 270. The U-shaped electrode 272 has two straight portions (i.e. the fin portion 232a and the fin portion 236a) connected to a first bottom portion (i.e. the first connection portion 245 between the fin portion 232a and the fin portion 236a). In addition, the U-shaped electrode 272 is formed through the second dielectric layer 216. The first bottom portion of the U-shaped electrode 272 is exposed from the second dielectric layer 216.

In some embodiments, the first electrode 244 of the MIM capacitor 500a can be constructed by at least one U-shaped electrode.

In the MIM capacitor 500a, any two fin portions close to each other and the second connection portion 248b connected to the two fin portions form an inverted U-shaped electrode relative to the U-shaped electrode in the cross-sectional representation shown in FIG. 1J. For example, the two fin portions 248a close to each other and the second connection portion 248b between the fin portions 248a collectively form an inverted U-shaped electrode 274 in the region 270. The inverted U-shaped electrode 274 has two straight portions (i.e. the fin portions 248a) connected to a second bottom portion (i.e. the second connection portion 248b between the fin portions 248a). The second bottom portion of the inverted U-shaped electrode 274 is exposed from the second dielectric layer 216.

In some embodiments, one of the two straight portions (i.e. fin portion 236a) of the U-shaped electrode 272 is clamped (sandwiched) by two straight portions (i.e. the fin portions 248a) of the inverted U-shaped electrode 274. In some embodiments, one of the two straight portions (i.e. the fin portion 248a between the fin portion 232a and the fin portion 236a) of the inverted U-shaped electrode 274 is clamped (sandwiched) by two straight portions (i.e. the fin portion 232a and fin portion 236a) of the U-shaped electrode 272.

In some embodiments, the second electrode 248 of the MIM capacitor 500a can be constructed by at least one inverted U-shaped electrode.

In some embodiments, the second bottom portion of the inverted U-shaped electrode 274 is separated from the straight portion of the U-shaped electrode 272 by a distance, which is substantially equal to the thickness T1 of the insulating film 246. In addition, the first bottom portion of the U-shaped electrode 272 is separated from the straight portion of the inverted U-shaped electrode 274 by a distance, which is substantially equal to the thickness T1 of the insulating film 246.

In some embodiments, the insulating film 246 of the MIM capacitor 500a includes a first top surface 276 and a second top surface 278 in different levels. The first top surface 276 is in contact with the second bottom portion of the inverted U-shaped electrode 274. The second top surface 278 is in contact with the fin portion 248a of the inverted U-shaped electrode 274.

FIGS. 2A to 2F are cross-sectional representations of various stages of forming a metal-insulator-metal (MIM) capacitor structure 600b including a metal-insulator-metal (MIM) capacitor 500b in accordance with some embodiments. The materials, configurations, structures and/or processes employed in FIGS. 1A to 1J may be utilized in the following embodiment and the details thereof may be omitted.

Figure 2A:
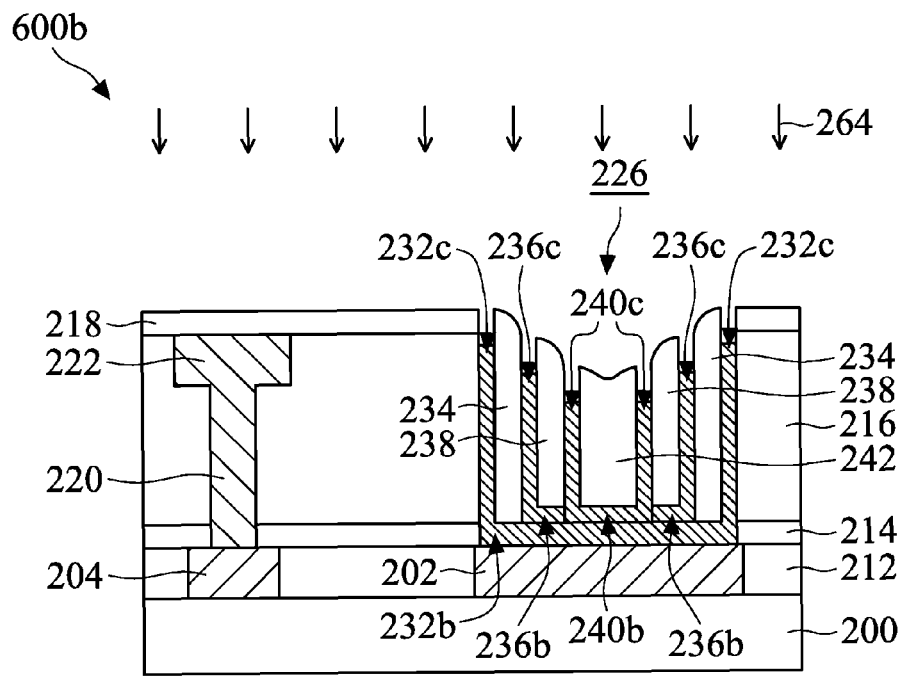
FIGS. 2A to 2F are cross-sectional representations of various stages of forming a metal-insulator-metal (MIM) capacitor structure in accordance with some embodiments.

After the structure of FIG. 1F is formed, a selective removal process 264 is performed to selectively remove portions of the fin portions 232a, the fin portions 236a and the fin portions 240a, as shown in FIG. 2A in accordance with some embodiments. In some embodiments, the conductive material for the fin portions 232a, the fin portions 236a and the fin portions 240a has a higher etching selectivity against the insulating material of the first insulating spacers 234, the second insulating spacers 238 and the third insulating spacers 242 during the selective removal process 264. After performing the selective removal process 264, the tops of the fin portions 232a, the fin portions 236a and the fin portions 240a are partially removed to form the fin portions 232c, the fin portions 236c and the fin portions 240c, respectively.

In some embodiments, tops of the fin portions 232c are lower than tops of the second dielectric layer 216 and the first insulating spacers 234, tops of the fin portions 236c are lower than tops of the first insulating spacers 234 and the second insulating spacers 238, and tops of the fin portions 240c are lower than tops of the second insulating spacers 238 and the third insulating spacers 242.

In some embodiments, the selective removal process 264 includes an etching process. In some embodiments, the etching process includes a dry etching process, a wet etching process, or another applicable process. In some embodiments, etching gases used in the dry etching process include fluorine/chlorine-containing (F/Cl-containing) gases.

Figure 2B:
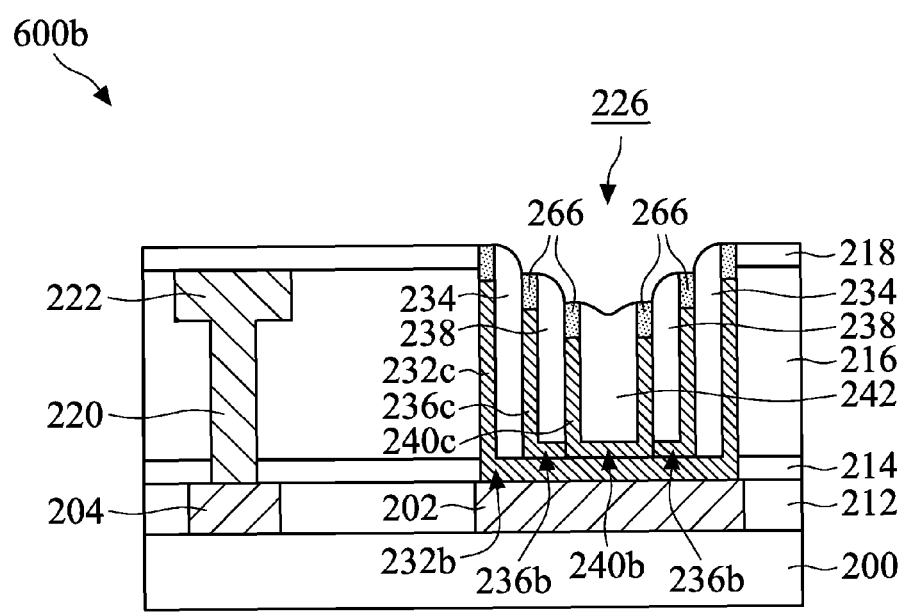

After the selective removal process 264 is performed, insulating pillars 266 are respectively formed over the tops of the fin portions 232c, the fin portions 236c and the fin portions 240c, as shown in FIG. 2B in accordance with some embodiments. In some embodiments, the insulating pillars 266 are directly above ends of the fin portions 232c, the fin portions 236c and the fin portions 240c, which are away from the first connection portion 245, respectively.

In some embodiments, the insulating pillars 266 are formed by a deposition process (not shown) and a subsequent removal process (not shown). The deposition process is performed to form an insulating material (not shown) over the tops of the fin portions 232c, the fin portions 236c and the fin portions 240c. The insulating material is also formed over the second etch stop layer 218. Then removal process is performed to remove insulating material above the second etch stop layer 218.

In some embodiments, the deposition process includes a plasma enhanced chemical vapor deposition (CVD) process, a low pressure CVD process, an atomic layer deposition (ALD) process, or another applicable process. In some embodiments, the removal process includes an etch-back process and/or a chemical mechanical polishing (CMP) process.

In some embodiments, the insulating pillars 266 are made of insulating materials that are different from the first insulating spacers 234, the second insulating spacers 238 and the third insulating spacers 242. In some embodiments, the insulating pillars 266 include insulating materials such as silicon nitride based material including SiN, SiCN and SiOCN.

Figure 2C:
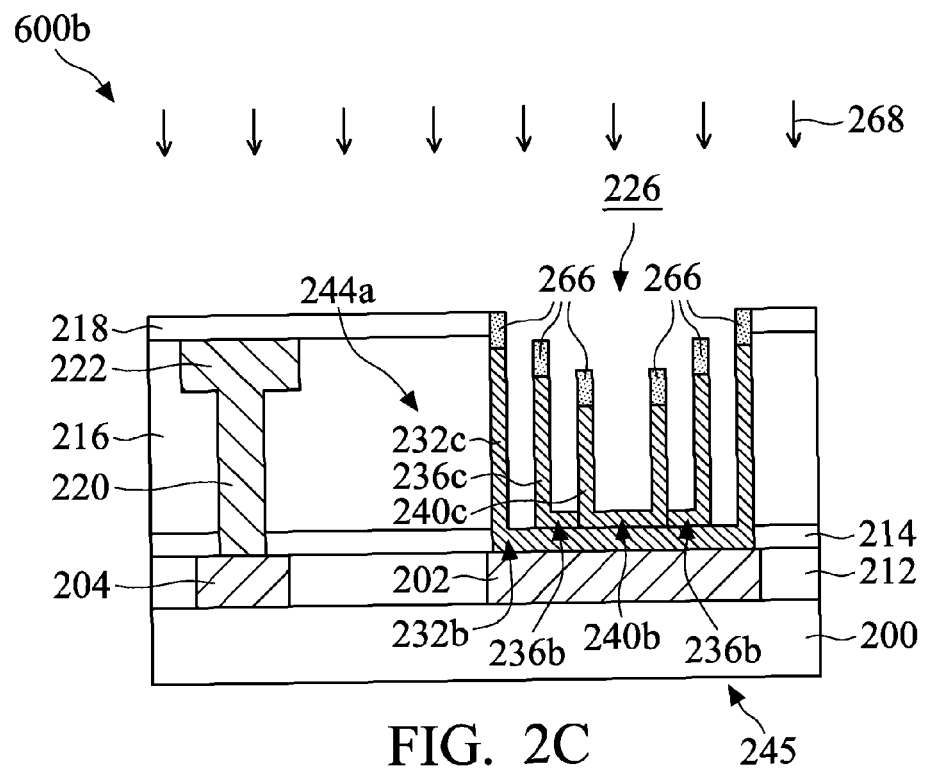

After insulating pillars 266 are formed, a selective etching process 268 is performed to remove the first insulating spacers 234, the second insulating spacers 238 and the third insulating spacers 242, as shown in FIG. 2C in accordance with some embodiments. In some embodiments, the conductive material for the fin portions 232c, the fin portions 236c and the fin portions 240c has a higher etching selectivity against the insulating material of the first insulating spacers 234, the second insulating spacers 238 and the third insulating spacers 242 during the selective etching process 268. In addition, the insulating materials for the second etch stop layer 218 and the insulating pillars 266 have a higher etching selectivity against the insulating material of the first insulating spacers 234, the second insulating spacers 238 and the third insulating spacers 242 during the selective etching process 268.

In some embodiments, the selective etching process 268 includes a dry cleaning process, a wet cleaning process, or another applicable process. In some embodiments, the dry cleaning process includes a vapor phase hydrofluoric acid (VHF) dipping process.

After performing the selective etching process 268, the first conductive layer 232, the second conductive layer 236, the third conductive layer 240 are exposed by the hole 226 (e.g. without being covered by any insulating spacers). A first (bottom) electrode 244a of the MIM capacitor 500b is formed.

In some embodiments, the first electrode 244a includes the fin portions 232c, the fin portions 236c, the fin portions 240c and the connection portion 245. In some embodiments, the connection portion 245 includes the bottom portion 232b, the bottom portion 236b and the bottom portion 240b, which are connected to each other. In addition, the insulating pillars 266 are respectively positioned over and directly on the tops of the fin portions 232c, the fin portions 236c and the fin portions 240c.

Figure 2D:
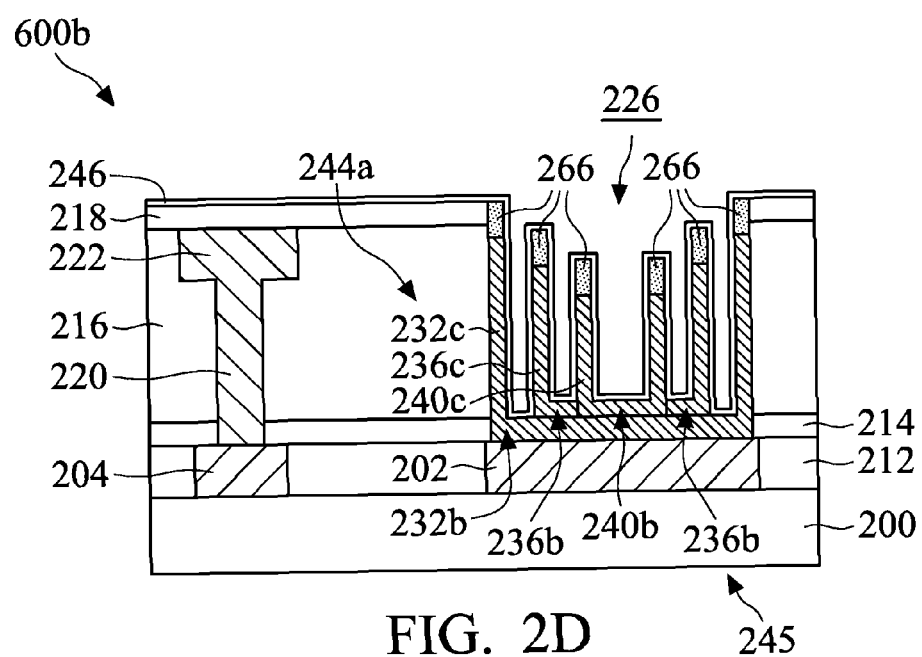

After first electrode 244a is formed, an insulating film 246 is formed over the first electrode 244a and the insulating pillars 266, as shown in FIG. 2D in accordance with some embodiments. The insulating film 246 is conformally formed on the first electrode 244a and the insulating pillars 266. That is, the insulating film 246 is formed lining the tops and sidewalls of the insulating pillars 266, the sidewall of the fin portions 232c, the fin portions 236c and the fin portions 240c, and the connection portion 245 between fin portions 232c, fin portions 236c and fin portions 240c.

Some materials and processes used to form the insulating film 246 shown in FIG. 2D may be similar to, or the same as, those used to form the insulating film 246 shown in FIG. 1H and are not repeated herein.

Figure 2E:
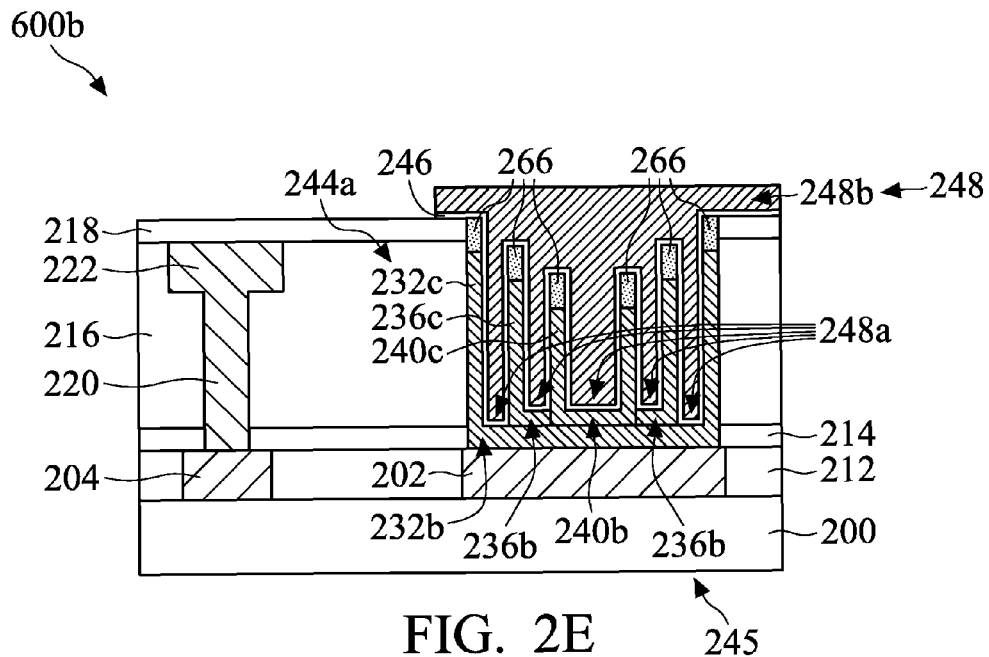

After insulating film 246 is formed, a second (top) electrode 248 of the MIM capacitor is formed over insulating film 246, as shown in FIG. 2E in accordance with some embodiments. The second electrode 248 is formed covering the insulating film 246, the insulating pillars 266 and filling the spaces between the fin portions 232c, the fin portions 236c and the fin portions 240c of the first electrode 244a.

Some materials and processes used to form the second electrode 248 shown in FIG. 2E may be similar to, or the same as, those used to form the insulating film 246 shown in FIG. 1I and are not repeated herein.

Figure 2F:
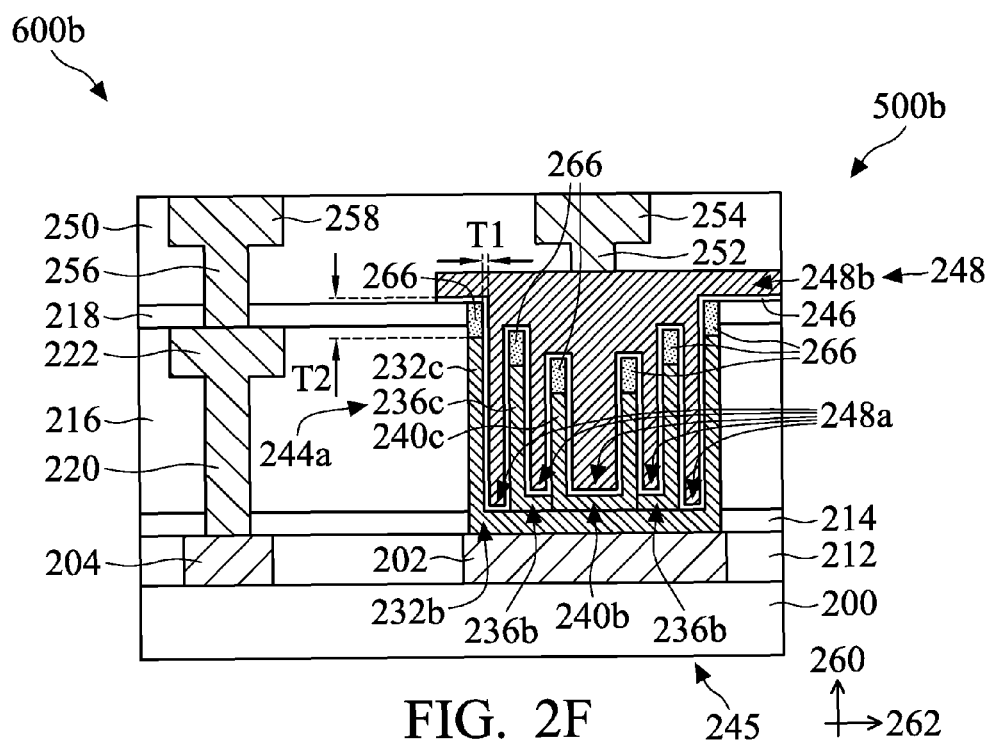

After the second electrode 248 is formed, a third dielectric layer 250 is formed on second etch stop layer 218. A via 252, a metal line 254, a via 256 and a metal line 258 are formed embedded in the third dielectric layer 250, as shown in FIG. 2F in accordance with some embodiments. The third dielectric layer 250 is formed covering the second electrode 248. Some materials and processes used to form the third dielectric layer 250 shown in FIG. 2F may be similar to, or the same as, those used to form third dielectric layer 250 shown in FIG. 1J and are not repeated herein. Some materials and processes used to form the via 252, the metal line 254, the via 256 and the metal line 258 shown in FIG. 2F may be similar to, or the same as, those used to form the via 252, the metal line 254, the via 256 and the metal line 258 shown in FIG. 1J and are not repeated herein.

After performing the aforementioned processes, the metal-insulator-metal (MIM) capacitor 500b is formed over the substrate 200, as shown in FIG. 2F in accordance with some embodiments.

In some embodiments, the MIM capacitor 500b is formed through second dielectric layer 216. The MIM capacitor 500b includes the first electrode 244a, the second electrode 248 and the insulating film 246 sandwiched between the first electrode 244 and the second electrode 248. In some embodiments, the configuration and/or structure of the first electrode 244a, the second electrode 248 and the insulating film 246 of the MIM capacitor 500b may be similar to, or the same as, the configuration and/or structure of the first electrode 244a, the second electrode 248 and the insulating film 246 of the MIM capacitor 500a and the details thereof may be omitted.

In some embodiments, the MIM capacitor 500b further includes the insulating pillars 266 respectively over the fin portions 232c, the fin portions 236c and the fin portions 240c of the first electrode 244a. In some embodiments, the second connection portion 248b of the second electrode 248 is separated from the fin portions 232c, the fin portions 236c and the fin portions 240c of the first electrode 244a through the insulating film 246 and the insulating pillars 266. In some embodiments, a distance (i.e. the total thickness T2 of the insulating film 246 and the insulating pillar 266) between the plurality of fin portions (i.e. the fin portions 232c, 236c and 240c) of the first electrode 244a and the second connection portion 248b of the second electrode 248 is different from a distance (i.e. the thickness T1 of insulating film 246) between the fin portions (i.e. the fin portions 232c, 236c and 240c) of the first electrode 244a and the fin portions 248a of the second electrode 248.

In some embodiments, the insulating pillars 266 can be used to separate the sharp edges at the tops of the fin portions of the first electrode 244a from the second electrode 248. In some embodiments, the insulating pillars 266 can protect the MIM capacitor 500b from damage.

FIGS. 3A to 3K are cross-sectional representations of various stages of forming a metal-insulator-metal (MIM) capacitor structure 600c including a metal-insulator-metal (MIM) capacitor 500c in accordance with some embodiments. The materials, configurations, structures and/or processes employed in FIGS. 1A to 1J and FIGS. 2A to 2F may be utilized in the following embodiment and the details thereof may be omitted.

After the first etch stop layer 214 of FIG. 1F is formed, a conductive pillar 306 is formed over the conductive feature 202. In some embodiments, the conductive pillar 306 is formed by performing a first patterning process, a deposition process and a second patterning process in sequence.

In some embodiments, the first patterning process is performed to form a hole (not shown) through the first etch stop layer 214 and directly over the conductive feature 202. The hole formed by the first patterning process provides the position of the subsequent conductive pillar 306. In some embodiments, the first patterning process includes a photolithography process and a subsequent etching process.

After the first patterning process is performed, the deposition process is performed to form a conductive layer (not shown) over the first etch stop layer 214. The conductive layer also fills the hole to be in contact with the conductive feature 202. In some embodiments, the deposition process includes a CVD process, a physical vapor deposition (PVD) process, an atomic layer deposition (ALD) process, or another applicable process.

After the deposition process is performed, the second patterning process is performed to remove a portion of the conductive layer (not shown) to form the conductive pillar 306 directly above and electrically connected to the conductive feature 202. In some embodiments, the second patterning process includes a photolithography process and a subsequent etching process. The photolithography process of the second patterning process uses a mask that is different from the first patterning process.

In some embodiments, the conductive pillar 306 is made of metals. In some embodiments, the conductive pillar 306 is made of aluminum, copper, tungsten, titanium, tantalum, titanium nitride, tantalum nitride, or another applicable material. In some embodiments, the conductive pillar 306 is made of poly-silicon. In some embodiments, a height H1 of the conductive pillar 306 is in a range from about 10000 Å to about 30000 Å.

In some embodiments, the conductive pillar 306 has a bottom portion 306a surrounded by the first etch stop layer 214. The bottom portion 306a of the conductive pillar 306 is in contact with the conductive feature 202. In some embodiments, a width W3 of the bottom portion 306a is less than the width W1 of the conductive feature 202, as shown in 3A. In some embodiments, the width W3 of the bottom portion 306a is equal to or greater than the width W1 of the conductive feature 202.

Figure 3A:
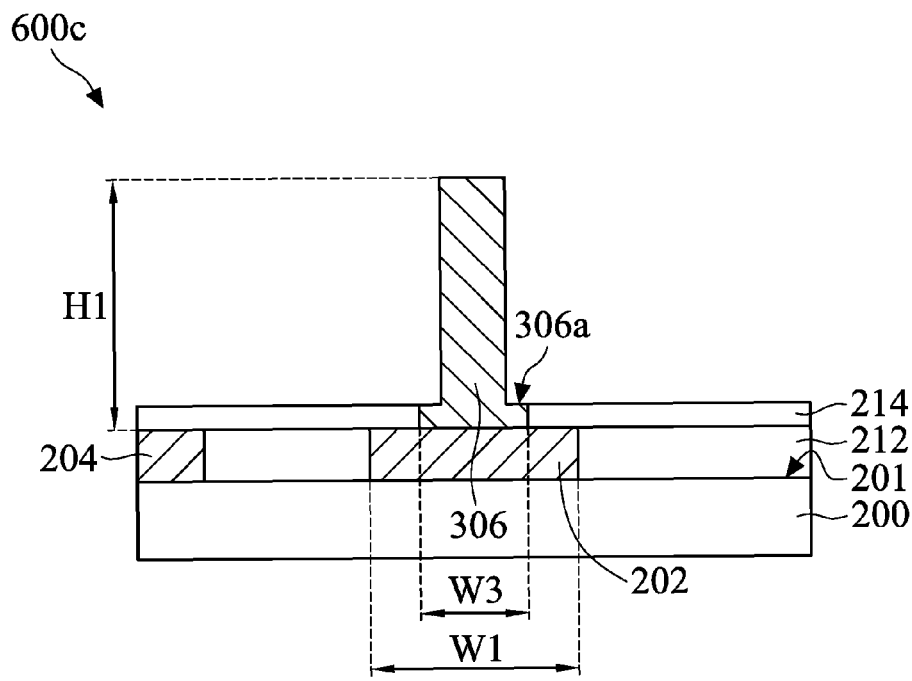
FIGS. 3A to 3K are cross-sectional representations of various stages of forming a metal-insulator-metal (MIM) capacitor structure in accordance with some embodiments.
Figure 3B:
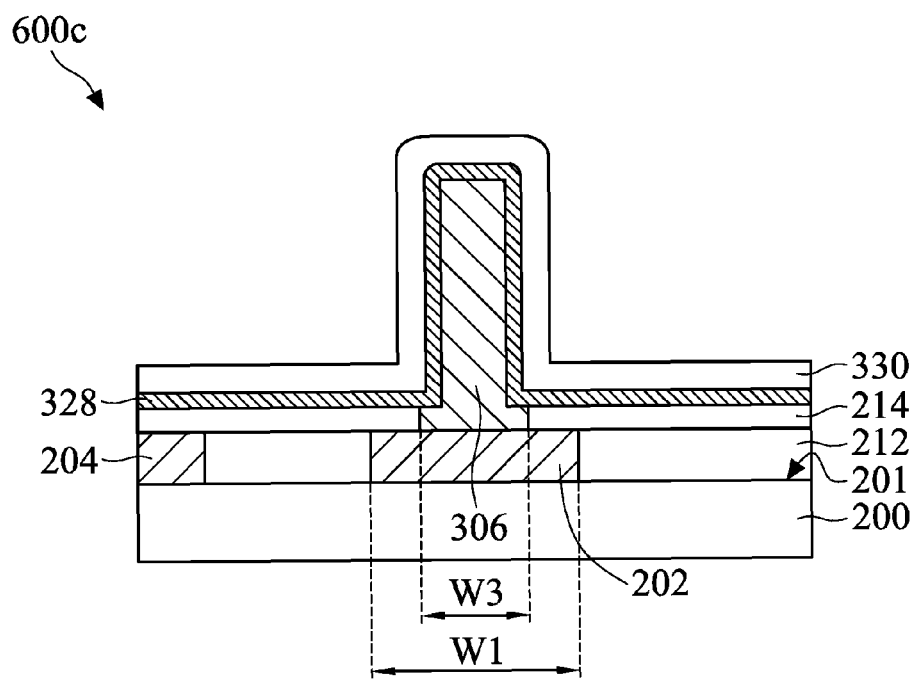

After the conductive pillar 306 is formed, a first conductive layer 328 and a first insulating layer 330 are sequentially formed over the first etch stop layer 214 and the conductive pillar 306, as shown in FIG. 3B in accordance with some embodiments. The first conductive layer 328 and the first insulating layer 330 are conformally formed on the first etch stop layer 214 and the conductive pillar 306. The first insulating layer 330 is separated from the conductive pillar 306 through the first conductive layer 328.

Some materials and processes used to form the first conductive layer 328 may be similar to, or the same as, those used to form first conductive layer 228. In addition, the thickness of the first conductive layer 328 may be similar to, or the same as, that of the first conductive layer 228. Some materials and processes used to form the first insulating layer 330 may be similar to, or the same as, those used to form the first insulating layer 230. In addition, the thickness of the first insulating layer 330 may be similar to, or the same as, that of the first insulating layer 230.

Figure 3C:
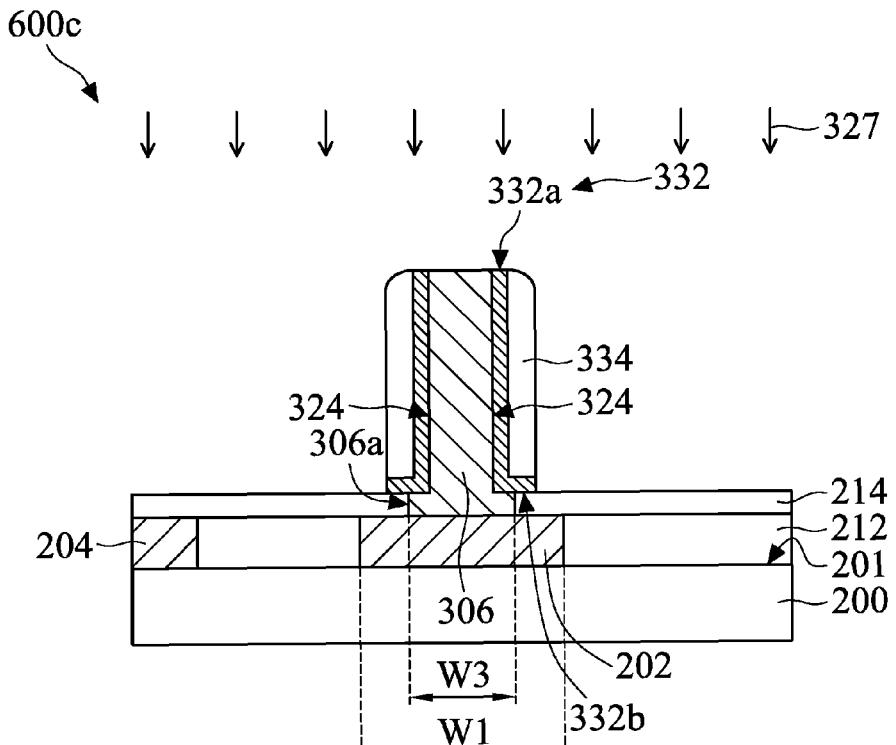

After the first conductive layer 328 and the first insulating layer 330 are formed, an etching process 327 is performed to form first composite spacers on the sidewalls of the conductive pillar 306, as shown in FIG. 3C in accordance with some embodiments. Each of the first composite spacers includes a first conductive layer 332 and a first insulating spacer 334 formed on a sidewall of the first conductive layer 332. As shown in FIG. 3C, the first conductive layers 332 are self-aligned to the sidewalls of the conductive pillar 306, and the first insulating spacer 334 are self-aligned to sidewalls of the first conductive layers 332 without using complicated aligning processes. The etching process 327 is performed to remove the first conductive layer 328 and the first insulating layer 330 above the conductive pillar 306 and the first etch stop layer 214 and to stop on the first etch stop layer 214. After the etching process 327 is performed, the self-aligned first conductive layer 332 and the self-aligned first insulating spacers 334 are formed on the sidewalls of the conductive pillar 306. Therefore, the conductive pillar 306 may serve as a supporter for the first conductive layers 332 and the first insulating spacers 334.

Each of the first conductive layer 332 includes a fin portion 332a and a bottom portion 332b connected to the fin portion 332a. The fin portions 332a are positioned adjacent to the sidewalls of the conductive pillar 306, respectively. The bottom portions 332b are positioned to be in contact with the bottom portion 306a of the conductive pillar 306. In addition, the bottom portions 332b are electrically coupled to the conductive feature 202. The fin portions 332a are in contact with the sidewalls 324 of the conductive pillar 306.

In some embodiments, the etching process 327 includes a dry etching process, a wet etching process, or another applicable process. In some embodiments, etching gases used in the dry etching process include fluorine-containing (F-containing) gases or fluorine/chlorine-containing (F/Cl-containing) gases.

Figure 3D:
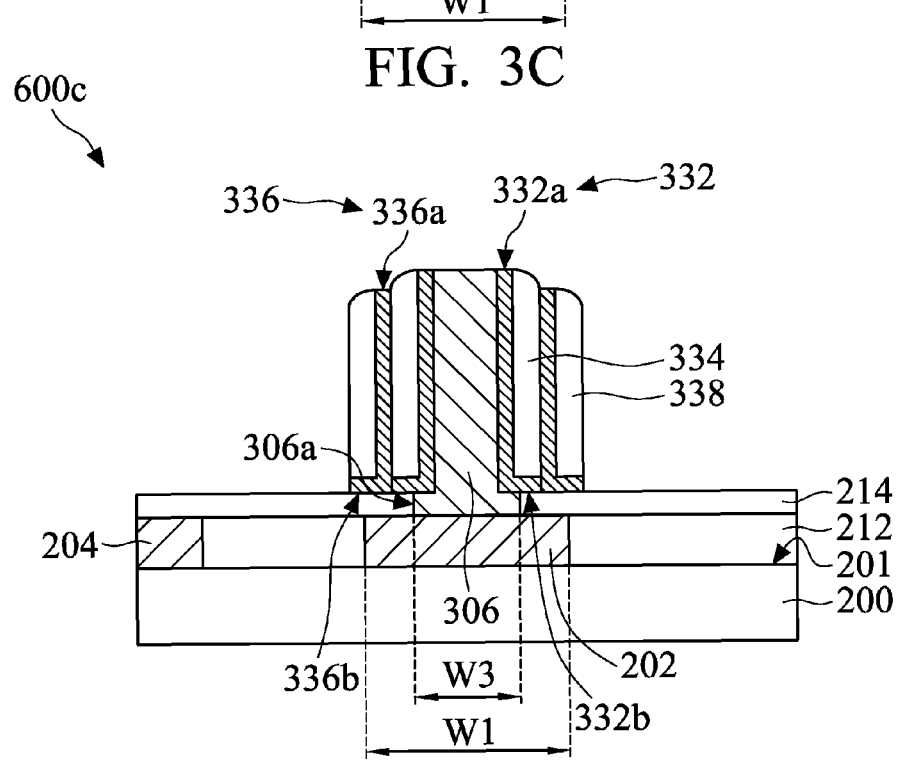

After the first conductive layers 332 and the first insulating spacers 334 are formed, processes similar to FIG. 3B to FIG. 3C are repeated to form second composite spacers on the sidewalls of the first composite spacers, as shown in FIG. 3D in accordance with some embodiments. Each of the second composite spacers includes a second conductive layer 336 (including a fin portion 336a and a bottom portion 336b) and a second insulating spacer 338 on the second conductive layer 336. As shown in FIG. 3D, the second conductive layers 336 are self-aligned to sidewalls of the first insulating spacers 334, and the second insulating spacers 338 are self-aligned to sidewalls of the second conductive layers 336 without using complicated aligning processes. Some materials and processes used to form the second conductive layers 336 may be similar to, or the same as, those used to form the first conductive layers 332. Some materials and processes used to form the second insulating spacers 338 may be similar to, or the same as, those used to form the first insulating spacers 334 and are not repeated herein.

Figure 3E:
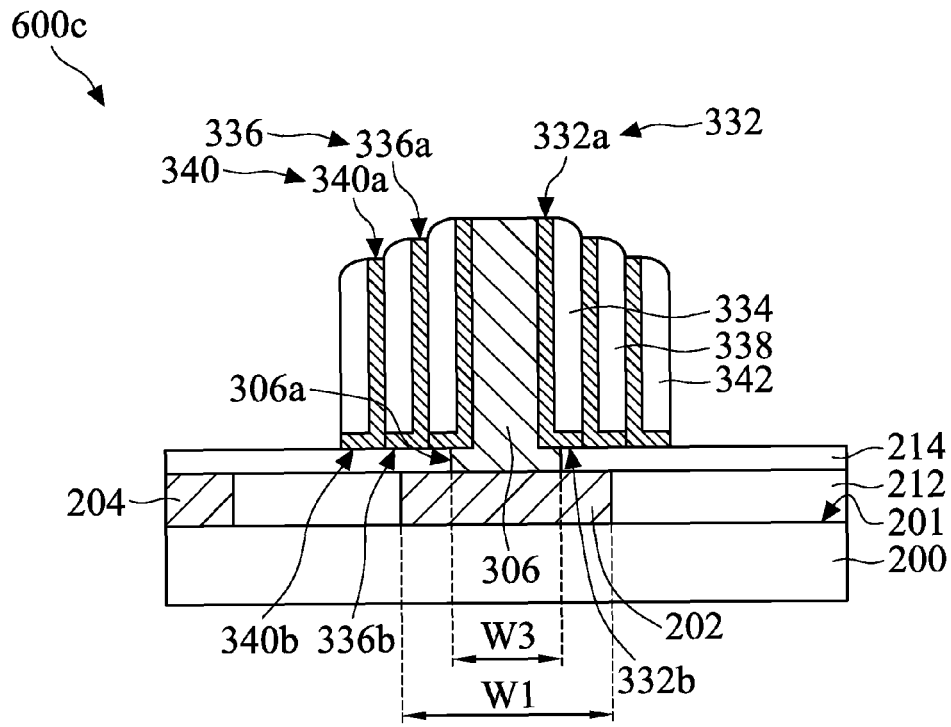

After the second composite spacers (including the second conductive layers 336 and the second insulating spacers 338) are formed, processes similar to FIG. 3B to FIG. 3C are repeated to form third composite spacers on the sidewalls of the second composite spacers, as shown in FIG. 3E in accordance with some embodiments. Each of the third composite spacers includes a third conductive layer 340 (including a fin portion 340a and a bottom portion 340b) and a third insulating spacer 342 on the third conductive layer 340. As shown in FIG. 3E, the third conductive layers 340 are self-aligned to sidewalls of the second insulating spacers 338, and the third insulating spacers 342 are self-aligned to sidewalls of the third conductive layers 340 without using complicated aligning processes. Some materials and processes used to form the third conductive layers 340 may be similar to, or the same as, those used to form the first conductive layers 332 and the second conductive layers 336. Some materials and processes used to form the third insulating spacers 342 may be similar to, or the same as, those used to form the first insulating spacers 334 and the second insulating spacers 338 and are not repeated herein.

In some embodiments, the processes similar to FIG. 3B to FIG. 3C are repeated one or more times. In some embodiments, the number of times that processes similar to FIG. 3B to FIG. 3C are repeated depends on the designed capacitance value of the resulting MIM capacitor. The embodiments as shown in FIG. 3E merely examples and are not intended to be limiting the disclosure.

Figure 3F:
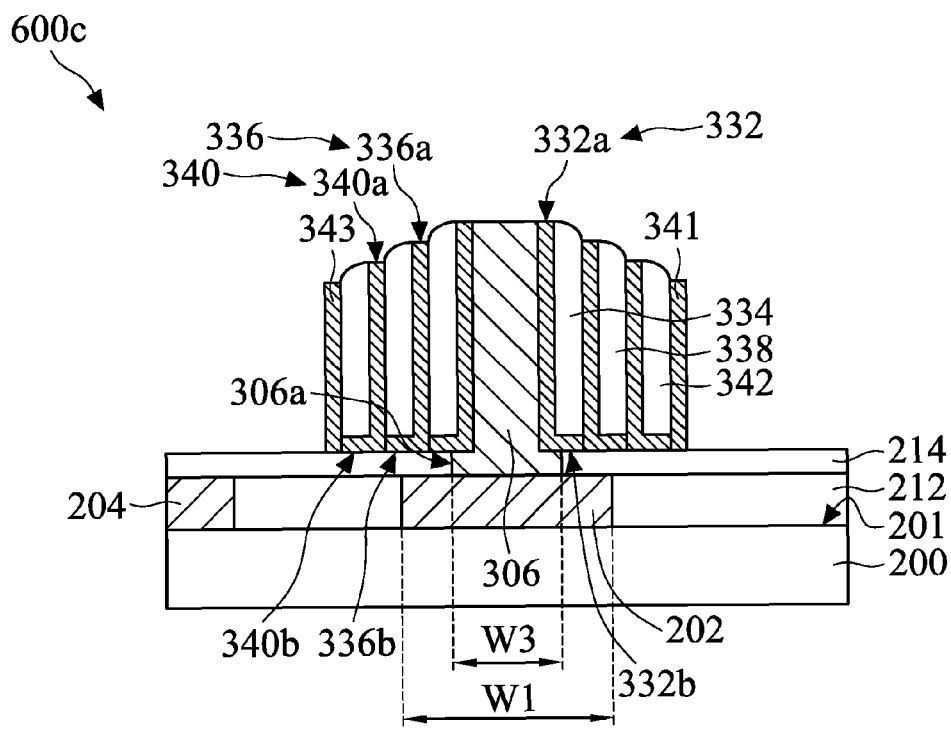

After the third conductive layer 340 and the third insulating spacers 342 are formed, fourth conductive layers (spacers) 341 are formed on outer sidewalls of the third insulating spacers 342, as shown in FIG. 3F in accordance with some embodiments. As shown in FIG. 3F, the fourth conductive layers 341 are self-aligned to sidewalls of the third insulating spacers 342 without using complicated aligning processes.

In some embodiments, the fourth conductive layers 341 are formed by a deposition process and a subsequent removal process. The deposition process is performed to form a conductive material (not shown) over the first etch stop layer 214. The insulating material is also formed covering the first composite spacers, the second composite spacers, the third composite spacers and the conductive pillar 306. Afterwards, the removal process is performed to remove the conductive material until the first etch stop layer 214 is exposed.

In some embodiments, the deposition process includes a CVD process, a PVD process, an atomic layer deposition (ALD) process, or another applicable process. In some embodiments, the removal process includes an etch-back process.

Some materials used to form the fourth conductive layers 341 may be similar to, or the same as, those used to form the first conductive layers 332, the second conductive layers 336 and the third conductive layers 340 and are not repeated herein.

In some embodiments, heights of the first conductive layer 332, the second conductive layer 336, the third conductive layer 340 and the fourth conductive layer 341 are decreased linearly from the first conductive layers 332 to the fourth conductive layers 341. In addition, heights of the first insulating spacers 334, the second insulating spacers 338 and the third insulating spacers 342 are decreased linearly from the first insulating spacers 334 to the third insulating spacers 342 shown in FIG. 3F.

In some embodiments, the bottom portions 332b are in contact with the bottom portions 336b, and the bottom portions 336b are in contact with the bottom portions 340b. In some embodiments, when the width W3 of the bottom portion 306a of the conductive pillar 306 is greater than the width W1 of the conductive feature 202 to connect to the fin portions 332a, 336a and 340a, the bottom portions 332b, 336b and 340b can be omitted.

Figure 3G:
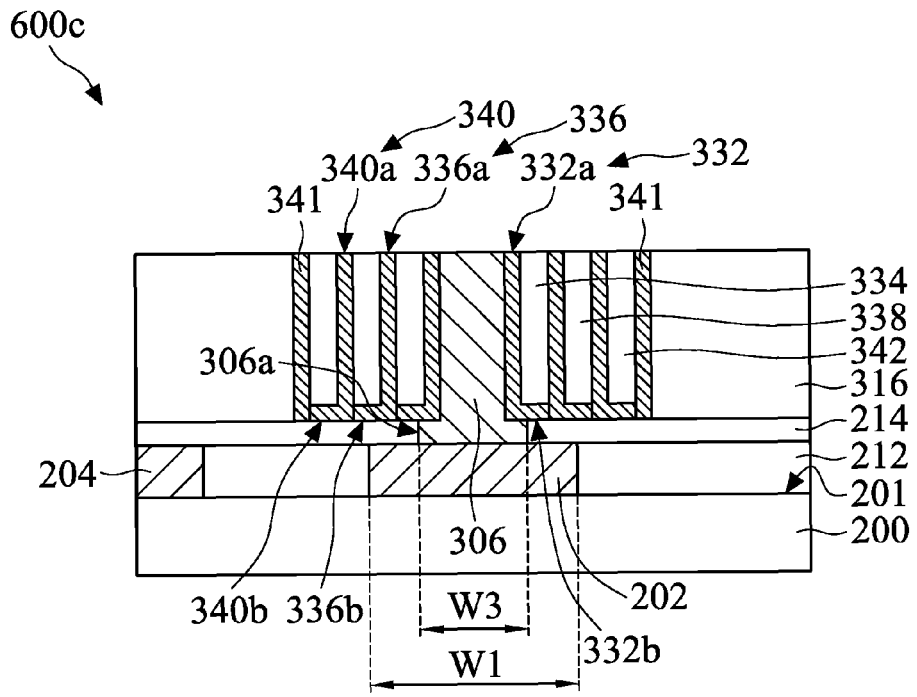

After the fourth conductive layers 341 are formed, an insulating layer 316 is formed over the first etch stop layer 214 and surrounding the fourth conductive layers 341, and a planarization process is performed afterwards, as shown in FIG. 3G in accordance with some embodiments. Some materials used to form the insulating layer 316 may be similar to, or the same as, those used to form the first insulating layer 230 and are not repeated herein.

The insulating layer 316 is formed by a deposition process. The deposition process is performed to entirely form an insulating material (not shown) over the first etch stop layer 214. The insulating material is also formed covering the fin portions 332a, 336a and 340a and the conductive pillar 306. Afterwards, the planarization process is performed to remove insulating material until the fourth conductive layers 341 are exposed. In some embodiments, top portions of the conductive pillar 306, the fin portions 332a, the fin portions 336a and the fin portions 340a are removed (e.g. polished). Such that the conductive pillar 306, the fin portions 332a, 336a and 340a and the fourth conductive layers 341 have the same height after planarization process is performed.

In some embodiments, the deposition process includes a plasma enhanced chemical vapor deposition (CVD) process, a low pressure CVD process, an atomic layer deposition (ALD) process, or another applicable process. In some embodiments, the planarization process includes an etch-back process and/or a chemical mechanical polishing (CMP) process.

Figure 3H:
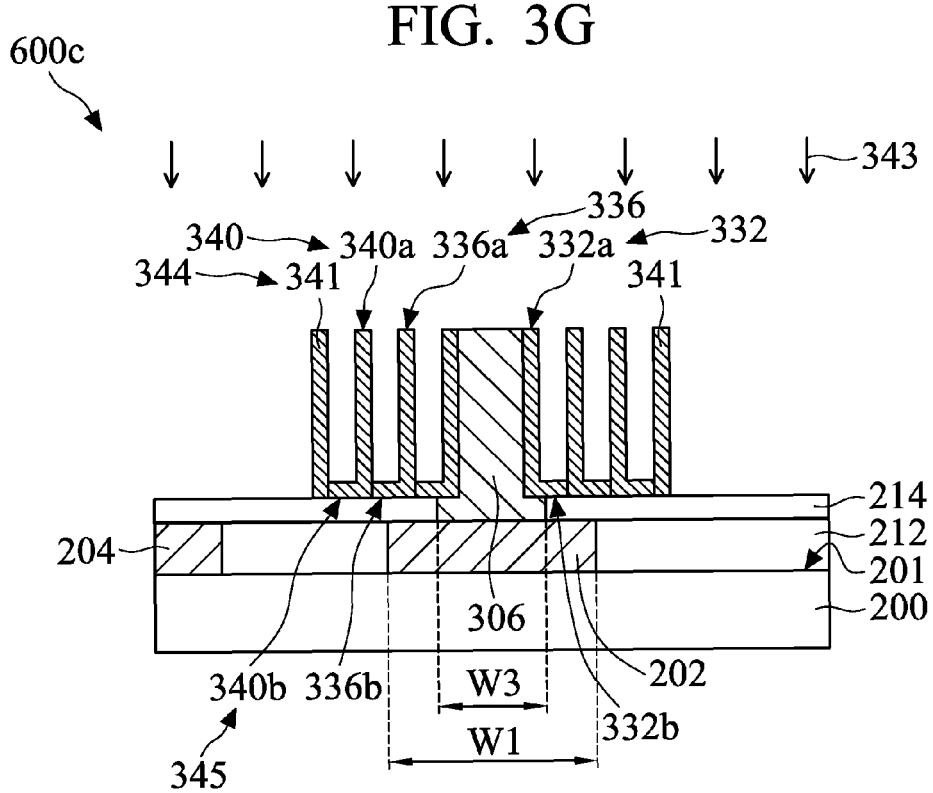

After insulating layer 316 is formed, a selective etching process 343 is performed to remove the first insulating spacers 334, the second insulating spacers 338, the third insulating spacers 342 and the insulating layer 316, as shown in FIG. 3H in accordance with some embodiments. Some processes used to performing the selective etching process 343 may be similar to, or the same as, those used to performing the selective etching process 243 and are not repeated herein.

After performing the selective etching process 343, the conductive pillar 306, the first conductive layer 332, the second conductive layer 336, the third conductive layer 340 are exposed not covered by any insulating spacers. A first (bottom) electrode 344 of the MIM capacitor is formed.

In some embodiments, the first electrode 344 includes the fin portions 332a, 336a and 340a and the fourth conductive layer 341 and a connection portion 345. In some embodiments, the connection portion 345 includes the bottom portion 332b, the bottom portion 236b and the bottom portion 340b. In some embodiments, the first electrode 344 is electrically connected to the conductive feature 202 through the conductive pillar 306.

Figure 3I:
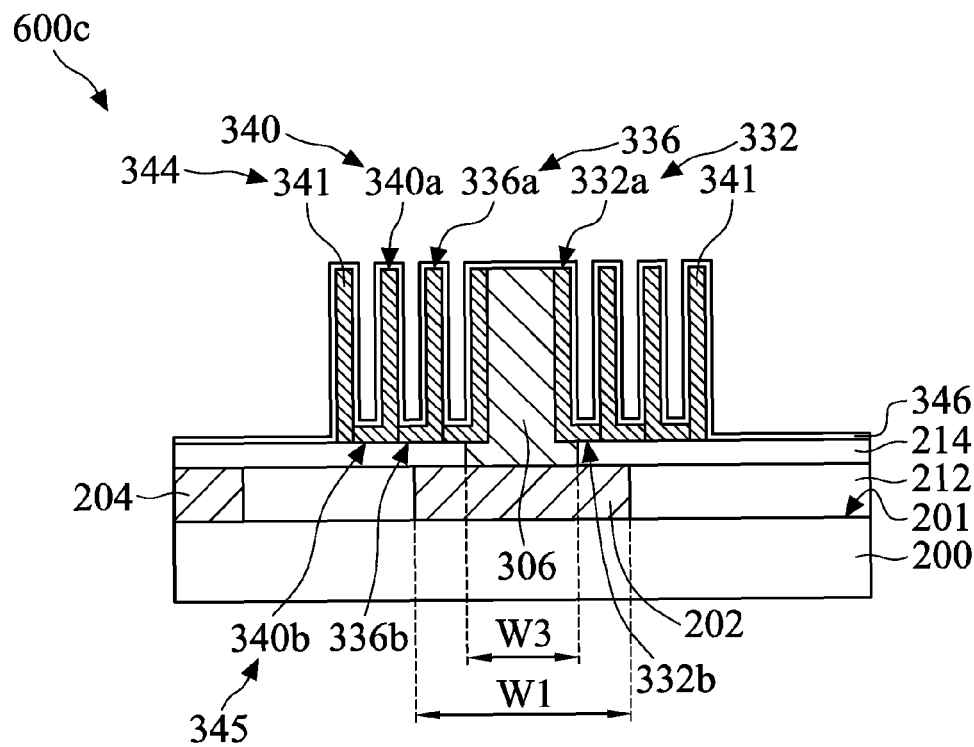

After the first electrode 344 is formed, an insulating film 346 is formed over the the first electrode 344, as shown in FIG. 3I in accordance with some embodiments. The insulating film 346 is conformally formed on the first electrode 344 and the conductive pillar 306 and extending over a portion of the first etch stop layer 214 outside the first electrode 344. Some materials and processes used to form the insulating film 346 may be similar to, or the same as, those used to form the insulating film 246 and are not repeated herein.

Figure 3J:
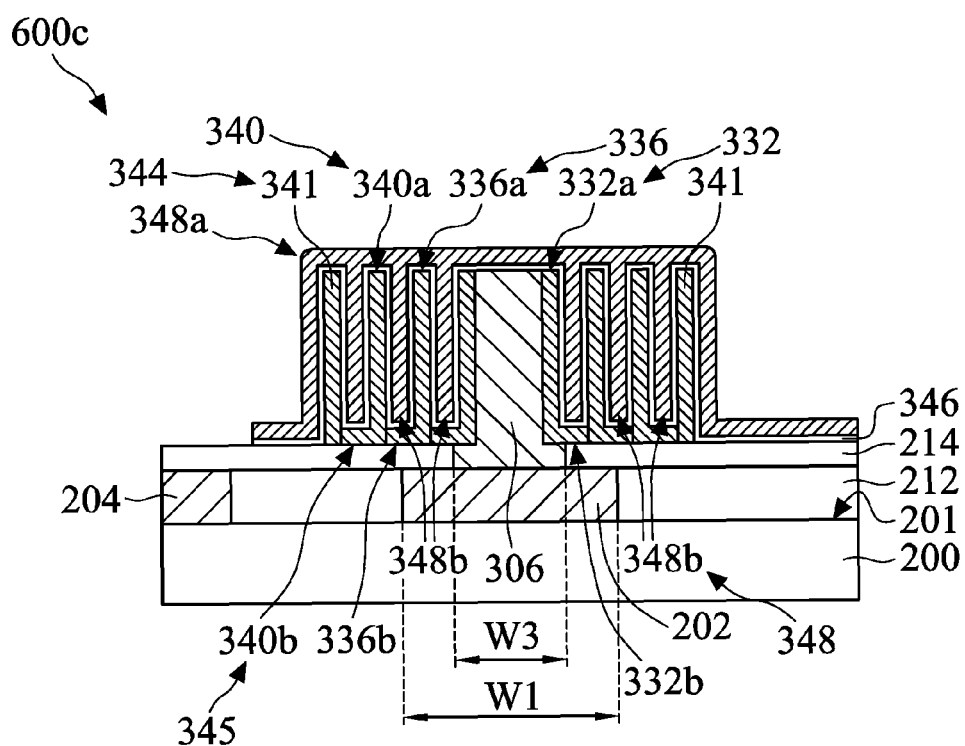

After the insulating film 346 is formed, a second (top) electrode 348 of the MIM capacitor is formed over the insulating film 346, as shown in FIG. 3J in accordance with some embodiments. The second electrode 348 is conformally formed covering the first electrode 344 and filling spaces between the fin portions 332a, 336a and 340a and the fourth conductive layer 341 of the first electrode 344. In some embodiments, the second electrode 348 is formed extending over a portion of the first etch stop layer 214 outside the first electrode 344.

Similar to the first electrode 344, the second electrode 348 includes fin portions 348a and a connection portion 348b. Tops and sidewalls of each of the fin portions 348a are in contact with the insulating film 346.

In some embodiments, a cross-sectional profile of the second electrode 348 is similar to an inverted cross-sectional profile of the first electrode 344. The fin portions 348a are positioned in the spaces between the fin portions 332a, the fin portions 332a, 336a and 340a and the fourth conductive layer 341 of the first electrode 344. In addition, the fin portions 348a of the second electrode 348 are alternately arranged with the fin portions 332a, 336a and 340a and the fourth conductive layer 341 of the first electrode 344. The connection portion 348b of the second electrode 348 covers the first electrode 344.

Some materials and processes used to form the second electrode 348 may be similar to, or the same as, those used to form the second electrode 248 and are not repeated herein.

Figure 3K:
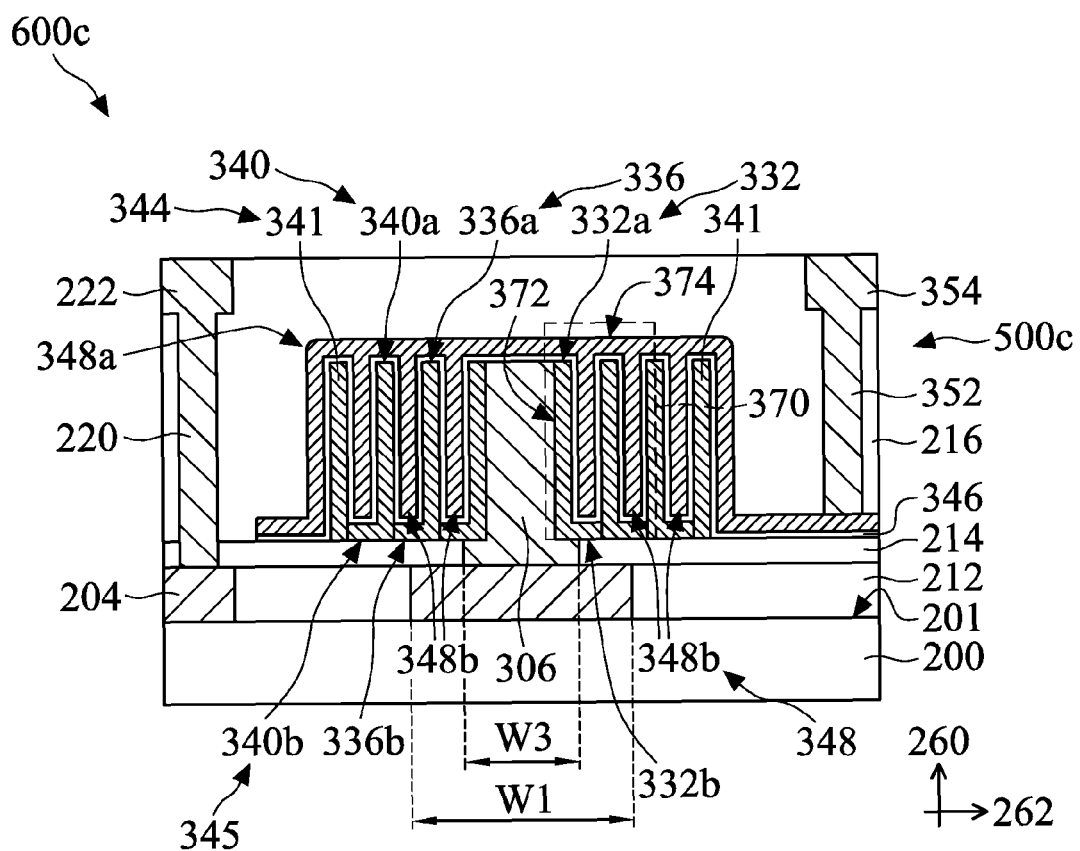

After the second electrode 348 is formed, the second dielectric layer 216 (such as an inter-metal dielectric (IMD) layer) is formed over the first etch stop layer 214. The via 220, the metal line 222, a via 352 and a metal line 354 are formed embedded in the second dielectric layer 216, as shown in FIG. 3K in accordance with some embodiments. The second dielectric layer 216 is formed covering the second electrode 248. Some materials and processes used to form the second dielectric layer 216 shown in FIG. 3K may be similar to, or the same as, those used to form the second dielectric layer 216 shown in FIG. 1A and are not repeated herein. Some materials and processes used to form the via 220 and the metal line 222 shown in FIG. 3K may be similar to, or the same as, those used to form the via 220 and the metal line 222 shown in FIG. 1A and are not repeated herein. Some materials and processes used to form the via 352 and the metal line 354 shown in FIG. 3K may be similar to, or the same as, those used to form the via 252 and the metal line 224 shown in FIG. 1J and are not repeated herein.

After performing the aforementioned processes, a metal-insulator-metal (MIM) capacitor 500c is formed over the substrate 200, as shown in FIG. 3K in accordance with some embodiments.

In some embodiments, the MIM capacitor 500c is covered by the second dielectric layer 216. The MIM capacitor 500c includes the first electrode 344, the second electrode 348 and the insulating film 346 sandwiched between the first electrode 344 and the second electrode 348. In some embodiments, the configuration and/or structure of the first electrode 344, the second electrode 348 and the insulating film 346 of the MIM capacitor 500c may be similar to, or the same as, the configuration and/or structure of the first electrode 244, the second electrode 248 and the insulating film 246 of the MIM capacitor 500a and the details thereof may be omitted.

In some embodiments, the first electrode 344 of the MIM capacitor 500c can be constructed by at least one U-shaped electrode, for example, a U-shaped electrode 372 in a region 370. In some embodiments, the second electrode 348 of the MIM capacitor 500c can be constructed by at least one inverted U-shaped electrode, for example, an inverted U-shaped electrode 374 in the region 370. In some embodiments, the configuration and/or structure of the U-shaped electrode 372 and inverted the U-shaped electrode 374 in the region 370 of the MIM capacitor 500c may be similar to, or the same as, the configuration and/or structure of the U-shaped electrode 272 and the inverted U-shaped electrode 274 in the region 270 of the MIM capacitor 500a and the details thereof may be omitted.

In some embodiments, the conductive pillar 306 is adjacent to the U-shaped electrode 374. In some embodiments, the conductive pillar 306 is provided as a supporter for self-aligned U-shaped electrode 374 forming on the sidewalls of the conductive pillar 306.

As described previously, a high-density metal-insulator-metal (MIM) capacitor structure and a method for forming the MIM capacitor structure are provided. The MIM capacitor structure (e.g. the MIM capacitor structures 600a, 600b and 600c) includes a MIM capacitor (e.g. the MIM capacitors 500a, 500b and 500c) on a substrate 200. The MIM capacitor includes a bottom electrode (e.g. the bottom electrodes 244, 244a and 344), a top electrode (e.g. the top electrodes 248 and 348) and an insulating layer (e.g. the insulating layers 246 and 346) between the bottom electrode and the top electrode. The bottom electrode has vertical fin portions (e.g. the fin portions 232a, 236a, 240a, 232c, 236c, 240c, 332a, 336a, 340, 314 and 341) formed self-aligned onto sidewalls of a dielectric layer (e.g. the dielectric layer 216) or sidewalls of a conductive pillar 306 over the substrate 200 without using additional masks. In some embodiments, the bottom electrode is constructed by at least one U-shaped electrode (e.g. the U-shaped electrodes 272 and 372) in a cross-sectional representation. The top electrode also has vertical fin portions (e.g. the fin portions 248a and 348a) alternately arranged with the vertical fin portions of the bottom electrode. In some embodiments, the top electrode is constructed by at least one inverted U-shaped electrode (e.g. the inverted U-shaped electrodes 274 and 374) in a cross-sectional representation. The area of the top electrode and the bottom electrode can be increased by forming the fin portions of the bottom electrode. Therefore, the MIM capacitor structure has high capacitance value and high integration density while the horizontal dimension of the MIM capacitor structure is kept.

Embodiments of a high-density metal-insulator-metal (MIM) capacitor structure and a method for forming the MIM capacitor structure are provided. The MIM capacitor structure includes a bottom electrode, a top electrode and an insulating layer between the bottom electrode and the top electrode. The bottom electrode has vertical fin portions formed self-aligned onto sidewalls of an inter-metal dielectric layer or sidewalls of a conductive pillar over a substrate without using additional masks. The area of the top electrode and the bottom electrode can be increased by forming the fin portions of the bottom electrode. Therefore, the MIM capacitor structure has high capacitance value and high integration density while the horizontal dimension of the MIM capacitor structure is kept.

In some embodiments, a metal-insulator-metal (MIM) capacitor structure is provided. The MIM capacitor structure includes a substrate. A MIM capacitor is formed on the substrate. The MIM capacitor includes a U-shaped electrode having a first portion. The MIM capacitor also includes an inverted U-shaped electrode. The first portion of the U-shaped electrode is clamped by the inverted U-shaped electrode. The MIM capacitor further includes an insulating film between the U-shaped electrode and the inverted U-shaped electrode.

In some embodiments, a metal-insulator-metal (MIM) capacitor structure is provided. The MIM capacitor structure includes a substrate. A MIM capacitor is formed on the substrate. The MIM capacitor includes a first electrode. The first electrode includes a first connection portion. The MIM capacitor also includes a plurality of first fin portions that protrude from the first connection portion along a first direction that is substantially perpendicular to a top surface of the substrate. The MIM capacitor further includes a second electrode in spaces between the plurality of first fin portions of the first electrode. The MIM capacitor further includes an insulating film between the first electrode and the second electrode.

In some embodiments, a method for forming a metal-insulator-metal (MIM) capacitor structure is provided. The method includes forming a conductive feature on a substrate. The method further includes forming a U-shaped electrode on the conductive feature. The method further includes forming an insulating film on the U-shaped electrode. The method further includes forming an inverted U-shaped electrode on the insulating film. A first portion of the U-shaped electrode is clamped by the inverted U-shaped electrode. A MIM capacitor is constructed by the U-shaped electrode, the insulating film and the inverted U-shaped electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor structure, comprising:
   a substrate; and
   a MIM capacitor on the substrate, wherein the MIM capacitor comprises:
      a U-shaped electrode having a first portion;
      an inverted U-shaped electrode, wherein the first portion of the U-shaped electrode is clamped by the inverted U-shaped electrode; and
      an insulating film between the U-shaped electrode and the inverted U-shaped electrode,
   wherein the U-shaped electrode further comprises:
      a second portion connected to the first portion through a first bottom portion,
   wherein the inverted U-shaped electrode further comprises:
      a third portion; and
      a fourth portion connected to the third portion through a second bottom portion,
   wherein the first portion of the U-shaped electrode is sandwiched between the third portion and the fourth portion of the inverted U-shaped electrode,
   wherein the MIM capacitor comprises:
      an insulating pillar over the first portion of the U-shaped electrode, so that the second bottom portion of the inverted U-shaped electrode is separated from the first portion of the U-shaped electrode through the insulating film and the insulating pillar.

2. The metal-insulator-metal (MIM) capacitor structure as claimed in claim 1, wherein the third portion of the inverted U-shaped electrode is clamped by the U-shaped electrode.

3. The metal-insulator-metal (MIM) capacitor structure as claimed in claim 2, wherein the insulating film comprises:
   a first top surface in contact with the second bottom portion of the inverted U-shaped electrode; and
   a second top surface in contact with the third portion of the inverted U-shaped electrode.

4. The metal-insulator-metal (MIM) capacitor structure as claimed in claim 1, further comprising:
   a dielectric layer surrounding the U-shaped electrode and the inverted U-shaped electrode, wherein the U-shaped electrode passes through the dielectric layer.

5. The metal-insulator-metal (MIM) capacitor structure as claimed in claim 4, wherein the first bottom portion is not covered by the dielectric layer.

6. The metal-insulator-metal (MIM) capacitor structure as claimed in claim 1, wherein the first portion and the second portion of the U-shaped electrode and the third portion and the fourth portion of the inverted U-shaped electrode extend along a first direction that is substantially perpendicular to a top surface of the substrate.

7. The metal-insulator-metal (MIM) capacitor structure as claimed in claim 6, wherein the first portion and the second portion of the U-shaped electrode are alternately arranged with the third portion and the fourth portion of the inverted U-shaped electrode substantially along a second direction that is substantially parallel to the top surface of the substrate.

8. The metal-insulator-metal (MIM) capacitor structure as claimed in claim 1, wherein the first portion of the U-shaped electrode has a first end away from the first bottom portion and close to the second bottom portion of the inverted U-shaped electrode.

9. The metal-insulator-metal (MIM) capacitor structure as claimed in claim 8, wherein the third portion of the inverted U-shaped electrode has a second end away from the second bottom portion and close to the first bottom portion of the U-shaped electrode.

10. The metal-insulator-metal (MIM) capacitor structure as claimed in claim 9, wherein a first distance between the first end and the second bottom portion is different from the a second distance between the second end and the first bottom portion.

11. A metal-insulator-metal (MIM) capacitor structure, comprising:
   a substrate; and
   a MIM capacitor on the substrate, wherein the MIM capacitor comprises:
      a first electrode, comprising:
         a first connection portion; and
         a plurality of first fin portions protruding from the first connection portion along a first direction that is substantially perpendicular to a top surface of the substrate;
      a second electrode in spaces between the plurality of first fin portions of the first electrode; and
      an insulating film between the first electrode and the second electrode,
   wherein the second electrode comprises:
      a second connection portion; and
      a plurality of second fin portions protruding from the second connection portion along the first direction,
   wherein the plurality of first fin portions and the plurality of second tin portions are alternately arranged substantially along a second direction that is substantially parallel to the top surface of the substrate.

12. The metal-insulator-metal (MIM) capacitor structure as claimed in claim 11, wherein the plurality of first fin portions respectively has first ends away from the first connection portion and close to the second connection portion.

13. The metal-insulator-metal (MIM) capacitor structure as claimed in claim 12, wherein the MIM capacitor comprises:

insulating pillars directly above the first ends of the plurality of first fin portions.

14. The metal-insulator-metal (MIM) capacitor structure as claimed in claim 11, further comprising:

a dielectric layer on the substrate, wherein the MIM capacitor passes through the dielectric layer.

15. The metal-insulator-metal (MIM) capacitor structure as claimed in claim 14, wherein the MIM capacitor comprises:

a conductive pillar adjacent to one of the plurality of first fin portions.

16. The metal-insulator-metal (MIM) capacitor structure as claimed in claim 12, wherein the plurality of second fin portions respectively has second ends away from the second connection portion and close to the first connection portion.

17. The metal-insulator-metal (MIM) capacitor structure as claimed in claim 16, wherein a first distance between the first ends and the second connection portion is different from the a second distance between the second ends and the first connection portion.

18. A method for forming a metal-insulator-metal (MIM) capacitor structure, comprising:

forming a conductive feature on a substrate;
forming a U-shaped electrode on the conductive feature;
forming an insulating film on the U-shaped electrode; and
forming an inverted U-shaped electrode on the insulating film, wherein a first portion of the U-shaped electrode is clamped by the inverted U-shaped electrode, wherein a MIM capacitor is constructed by the U-shaped electrode, the insulating film and the inverted U-shaped electrode, the method further comprises:

forming a dielectric layer on the conductive feature; and
forming a via in the dielectric layer, so that the conductive feature is exposed to the via before forming the U-shaped electrode, wherein forming the U-shaped electrode comprises:

forming a first conductive layer on a sidewall and a bottom of the via;
forming a first insulating spacer on the first conductive layer on the sidewall of the via;
forming a second conductive layer on the insulating film on the sidewall of the via;
forming a second insulating spacer on the second conductive layer on the sidewall of the via; and
removing the first insulating spacer and the second insulating spacer.

19. The method for forming the metal-insulator-metal (MIM) capacitor structure as claimed in claim 18, further comprising:

removing a portion of the first conductive layer and a portion of the second conductive layer, so that tops of the first conductive layer and the second conductive layer are lower than tops of the first insulating spacer and the second insulating spacer; and
forming insulating pillars on the tops of the first conductive layer and the second conductive layer before removing the first insulating spacer and the second insulating spacer.

20. The method for forming the metal-insulator-metal (MIM) capacitor structure as claimed in claim 18, wherein forming the U-shaped electrode comprises:

forming a conductive pillar on the conductive feature;
forming a first composite spacer on a sidewall of the conductive pillar, wherein the first composite spacer comprises a first conductive spacer and a first insulating spacer separated from the conductive pillar through the first conductive spacer;
forming a second composite spacer on a sidewall of the first composite spacer, wherein a second composite spacer comprises a second conductive spacer, which is in contact with the first conductive spacer, and a second insulating spacer, which is separated from the first insulating spacer through the second conductive spacer; and
removing the first insulating spacer and the second insulating spacer.

* * * * *